US007782053B2

(12) United States Patent
Kanda et al.

(10) Patent No.: US 7,782,053 B2
(45) Date of Patent: Aug. 24, 2010

(54) MAGNETIC RESONANCE IMAGING APPARATUS AND NAVIGATOR DATA ANALYZING METHOD

(75) Inventors: Kenichi Kanda, Tokyo (JP); Yuji Iwadate, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 64 days.

(21) Appl. No.: 12/200,818

(22) Filed: Aug. 28, 2008

(65) Prior Publication Data

US 2009/0066329 A1    Mar. 12, 2009

(30) Foreign Application Priority Data

Aug. 28, 2007  (JP)  ............................. 2007-221489

(51) Int. Cl.
G01V 3/00    (2006.01)
(52) U.S. Cl. ..................................................... 324/307
(58) Field of Classification Search ......... 324/300–322;
600/410–435
See application file for complete search history.

(56) References Cited

U.S. PATENT DOCUMENTS

| | | | |
|---|---|---|---|
| 6,037,771 A * | 3/2000 | Liu et al. ..................... 324/309 |
| 6,275,720 B1 | 8/2001 | Du et al. |
| 6,426,990 B1 | 7/2002 | Cesmeli |
| 6,535,754 B2 | 3/2003 | Fishbein et al. |
| 6,718,004 B2 | 4/2004 | Cesmeli |
| 7,012,428 B1 | 3/2006 | Ward et al. |
| 7,012,603 B2 | 3/2006 | Chen et al. |
| 7,245,786 B2 * | 7/2007 | Mitchell et al. ............. 382/280 |
| 7,332,911 B2 | 2/2008 | Iwadate et al. |
| 7,502,526 B2 * | 3/2009 | Mitchell et al. ............. 382/280 |
| 2002/0065455 A1 | 5/2002 | Ben-Haim et al. |

(Continued)

FOREIGN PATENT DOCUMENTS

JP    10-277010    10/1998

(Continued)

OTHER PUBLICATIONS

Yiping P. Du, Manojkumar Saranathan, and Thomas K. F. Foo. "An Accurate, Robust, and Computationally Efficient Navigator Algorithm for Measuring Diaphragm Positions", Journal of Cardiovascular Magnetic Resonance vol. 6, No. 2, pp. 483-490, 2004.

Primary Examiner—Brij B Shrivastav
Assistant Examiner—Dixomara Vargas
(74) Attorney, Agent, or Firm—Armstrong Teasdale LLP

(57) ABSTRACT

A magnetic resonance imaging apparatus executes scans for executing a navigator sequence for acquiring as navigator data a magnetic resonance signal from a navigator area containing tissues body-moved in a subject and executing an imaging sequence for acquiring a magnetic resonance signal from an imaging area as imaging data at the subject, thereby to generate an image with respect to the imaging area. The magnetic resonance imaging apparatus includes, a phase profile generating part which generates a phase profile so as to show a relationship between a phase of the navigator data and a position of the navigator area, a phase correcting part which corrects folding back of the phase profile generated by the phase profile generating part, and a position detecting part which detects a position of a tissue body-moved in the navigator area, based on the phase profile corrected by the phase correcting part.

20 Claims, 19 Drawing Sheets

U.S. PATENT DOCUMENTS

| | | |
|---|---|---|
| 2002/0183611 A1 | 12/2002 | Fishbein et al. |
| 2003/0050554 A1 | 3/2003 | Schaffer |
| 2004/0092809 A1 | 5/2004 | DeCharms |
| 2004/0102695 A1 | 5/2004 | Stergiopoulos et al. |
| 2006/0224062 A1 | 10/2006 | Aggarwal et al. |
| 2007/0080690 A1 | 4/2007 | Takei et al. |
| 2007/0088212 A1 | 4/2007 | Takei et al. |
| 2009/0238430 A1* | 9/2009 | Haider et al. ............... 382/131 |

FOREIGN PATENT DOCUMENTS

| | | |
|---|---|---|
| JP | 2007-098026 | 4/2007 |
| JP | 2007-111188 | 5/2007 |

* cited by examiner (a)

(b)

MAGNETIC RESONANCE IMAGING APPARATUS AND NAVIGATOR DATA ANALYZING METHOD

CROSS REFERENCE TO RELATED APPLICATIONS

This application claims the benefit of Japanese Patent Application No. 2007-221489 filed Aug. 28, 2008, which is hereby incorporated by reference in its entirety.

BACKGROUND OF THE INVENTION

The subject matter disclosed herein relates to a magnetic resonance imaging (MRI) apparatus and a navigator data analyzing method, and particularly to a magnetic resonance imaging apparatus which executes scans for transmitting RF pulses to a subject within a static magnetic field space and acquiring magnetic resonance signals from the subject thereby to produce an image about the subject, and a navigator data analyzing method for analyzing navigator data obtained by executing scans, for detecting the position of each tissue in a subject.

A magnetic resonance imaging apparatus executes scans for applying an electromagnetic wave to a subject lying within a static magnetic field space thereby to excite spins of proton in the subject by a nuclear magnetic resonance phenomenon and acquiring magnetic resonance signals generated by the excited spins. This is an apparatus that generates a slice image with respect to a tomographic plane of the subject, based on the magnetic resonance signals obtained by the scans.

There is a case in which body-motion artifacts occur in the generated slice image where body motion occurs in the subject upon imaging the subject using the magnetic resonance imaging apparatus. When, for example, the heart or abdominal region of the subject is imaged, body motion artifacts occur due to body motion such as breathing exercises, cardiac motion or the like, thus degrading the quality of the image.

Thus, there have been proposed methods for solving the problem of the degradation in the image due to the body motion artifacts. One method thereof is that upon imaging under normal respiration, for example, an excitation section of a subject is corrected in real time according to a change in the position of the diaphragm and each magnetic resonance signal is always measured from the same section, thereby preventing the degradation in the image due to the body motion artifacts. An imaging sequence is changed or imaging data is selected through the use of acquired navigator echoes, thereby preventing degradation in image quality due to body motion artifacts (refer to, for example, Japanese Unexamined Patent Publication No. 2007-111188 and Japanese Unexamined Patent Publication No. 2007-98026).

As a method for detecting the position of the diaphragm, which is used in these techniques, there has been known a method for tracking the motion of the diaphragm using navigator echoes and performing respiratory synchronization and gating using acquired navigator data (refer to, for example, Japanese Unexamined Patent Publication No. Hei 10(1998)-277010).

As navigator data analyzing methods, there have been known, for example, an Ahn method, an LSQ method, an edge detecting method, etc. (refer to, for example, Yiping P. Du, Manojkumar Saranathan, and Thomas K. F. Foo. "An Accurate, Robust, and Computationally Efficient Navigator Algorithm for Measuring Diaphragm Positions", JOURNAL OF CARDIOVASCULAR MAGNETIC RESONANCE Vol. 6, No. 2, pp. 483-490, 2004).

As a result that as shown in a coronal image of FIG. 18, an imaging area IA for executing an imaging scan to acquire imaging data has overlapped with a navigator area NA corresponding to the position of acquisition of navigator data, signal disturbance due to slice interference occurs in the acquired navigator data. As indicated by a broken-line area of FIG. 19, noise occurs in a signal intensity profile obtained by plotting the relationship between signal intensity I of acquired navigator data and a position L of a navigator area. Here, the broken-line area shown in FIG. 19 indicates a signal intensity profile corresponding to a portion where the imaging area IA and the navigator area NA shown in FIG. 18 overlap. In doing so, it became difficult to obtain a stable analytic result by the conventional navigator data analyzing method shown above.

BRIEF DESCRIPTION OF THE INVENTION

It is desirable that the problem described previously is solved. Thus, the invention provides a magnetic resonance imaging apparatus capable of preventing deterioration in image by obtaining a stable analytic result of navigator data, and a navigator data analyzing method capable of obtaining a stable analytic result of navigator data.

Further, the invention provides a magnetic resonance imaging apparatus capable of preventing image deterioration by obtaining a stable analytic result of navigator data even when an imaging slice based on an imaging scan and a navigator area have overlapped, and a navigator data analyzing method capable of obtaining a stable analytic result of navigator data.

In a first aspect, the invention provides a magnetic resonance imaging apparatus which executes scans for executing a navigator sequence for acquiring as navigator data a magnetic resonance signal from a navigator area containing tissues body-moved in a subject and executing an imaging sequence for acquiring a magnetic resonance signal from an imaging area as imaging data at the subject, thereby to generate an image with respect to the imaging area, including a phase profile generating part which generates a phase profile so as to show a relationship between a phase of the navigator data and a position of the navigator area, a phase correcting part which corrects folding back of the phase profile generated by the phase profile generating part, and a position detecting part which detects a position of a tissue body-moved in the navigator area, based on the phase profile corrected by the phase correcting part.

Preferably, the magnetic resonance imaging apparatus has a range setting part which sets a range for detecting a position of each tissue in the subject, in the phase profile of the magnetic resonance signal, which is subjected to phase correction by the phase correcting part.

Preferably, the position detecting part detects the position of the tissue in the subject by an edge detecting method.

Preferably, the position detecting part detects the position of the tissue in the subject by an LSQ method.

Preferably, the position detecting part detects the position of the tissue in the subject by a correlation coefficient method.

Preferably, the position detecting part detects the position of the tissue in the subject by a mutual information amount method.

Preferably, the tissue is the diaphragm.

Preferably, the magnetic resonance imaging apparatus has a phase profile smoothing part which smoothes the phase profile subjected to the phase correction by the phase correcting part.

In a second aspect, a navigator data analyzing method of the invention is a navigator data analyzing method for executing scans for transmitting RF pulses to a subject within a static magnetic field space and acquiring magnetic resonance signals from the subject thereby to acquire imaging data for generating a slice image of the subject and navigator data for detecting a position of each tissue in the subject, and analyzing the acquired navigator data, which includes a first step for generating a phase profile so as to show a relationship between a phase of the navigator data and a position of a navigator area, a second step for correcting folding back of the phase profile generated in the first step, and a third step for detecting a position of a tissue body-moved in the navigator area, based on the phase profile whose folding back is corrected in the second step.

Preferably, the navigator data analyzing method includes, after the second step, a step for setting a range for detecting a position of each tissue in the subject in the phase profile subjected to the phase correction.

Preferably, the third step detects the position of the tissue in the subject by an edge detecting method.

Preferably, the third step detects the position of the tissue in the subject by an LSQ method.

Preferably, the third step detects the position of the tissue in the subject by a correlation coefficient method.

Preferably, the third step detects the position of the tissue in the subject by a mutual information amount method.

Preferably, the tissue is the diaphragm.

Preferably, the navigator data analyzing method includes, after the second step, a step for smoothing the phase profile subjected to the phase correction in the second step.

According to the invention, there can be provided a magnetic resonance imaging apparatus and a navigator data analyzing method both capable of obtaining a stable analytic result of navigator data even when an imaging slice based on an imaging scan and a navigator area overlap.

Further objects and advantages of the present invention will be apparent from the following description of the preferred embodiments of the invention as illustrated in the accompanying drawings.

DETAILED DESCRIPTION OF THE INVENTION

A respective one embodiment according to the invention will hereinafter be explained with reference to the accompanying drawings.

Figure 1:
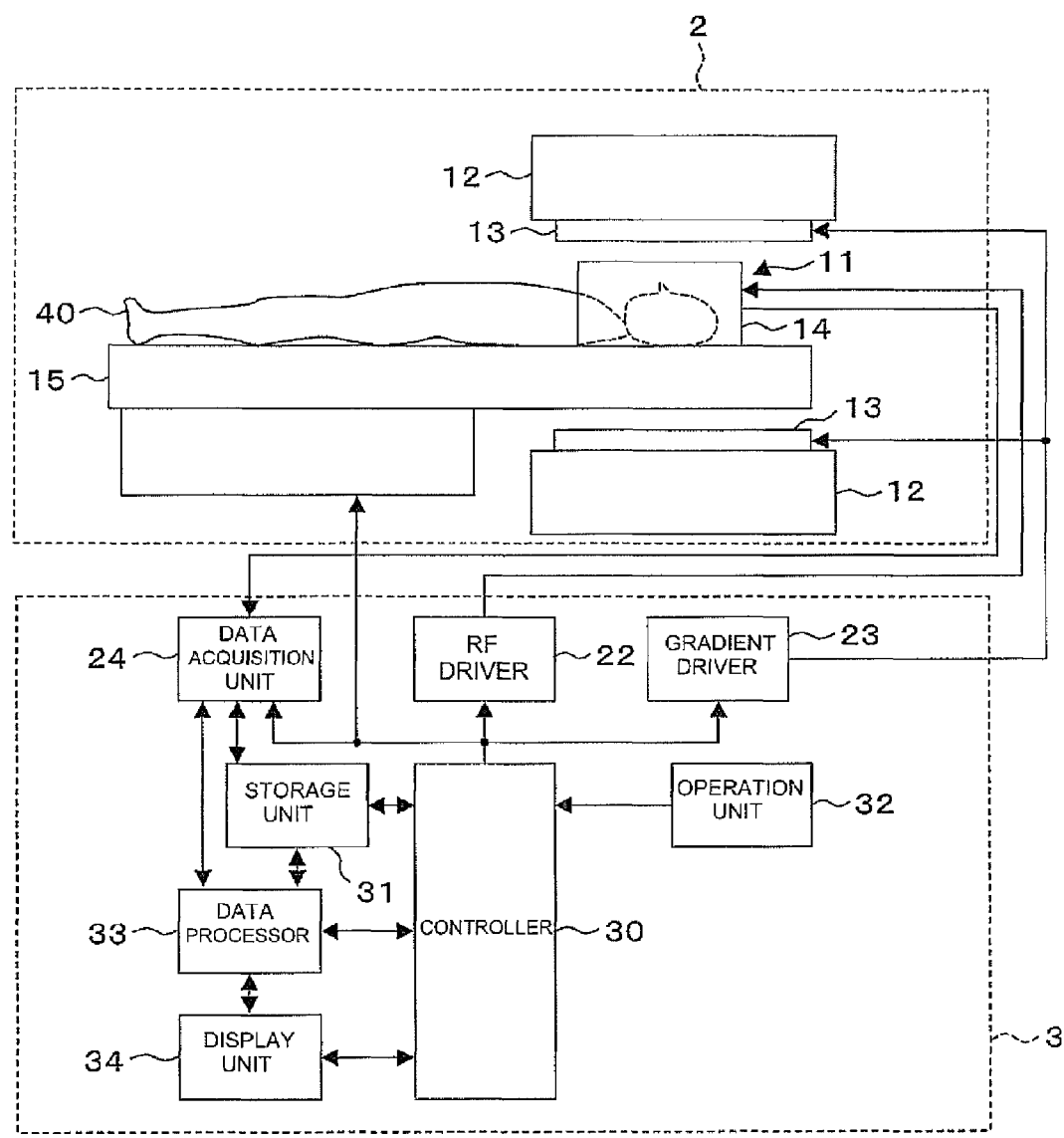
FIG. 1 is a constructional diagram showing a construction of a magnetic resonance imaging apparatus constituted of an RF coil unit employed in a first embodiment according to the invention.

FIG. 1 is a constructional diagram showing a construction of a magnetic resonance imaging apparatus constituted of an RF coil unit employed in a first embodiment according to the invention. The present apparatus is one example of embodiments according to the invention.

As shown in FIG. 1, the magnetic resonance imaging apparatus 1 has a scan section 2 and an operation console section 3. Here, the scan section 2 has a static magnetic field magnet unit 12, a gradient coil unit 13, an RF coil unit 14 and a cradle 15. The operation console section 3 has an RF driver 22, a gradient driver 23, a data acquisition unit 24, a controller 30, a storage unit 31, an operation unit 32, a data processor 33 and a display unit 34.

The scan section 2 will be explained.

As shown in FIG. 1, the scan section 2 includes a static magnetic field space 11 in which an imaging slice area in a subject 40 is held or accommodated. The scan section 2 applies RF pulses to the corresponding imaging area of the subject 40 held in the static magnetic filed space 11 formed with a static magnetic field, based on a control signal outputted from the operation console unit 3 and executes a scan for acquiring each magnetic resonance signal from the imaging area thereof.

In the present embodiment, the scan section 2 repeatedly executes an imaging sequence IS for obtaining a magnetic resonance signal produced at an imaging area IA of the subject 40 as imaging data, and a navigator sequence NS for acquiring a magnetic resonance signal produced at a navigator area NA of the subject 40 as navigator data.

Respective constituent elements of the scan section 2 will be explained sequentially.

The static magnetic field magnet unit 12 is provided to form a static magnetic field in the static magnetic field space 11 with the subjected 40 held therein. The static magnetic field magnet unit 12 is of a horizontal magnetic field type and forms a static magnetic field through a superconductive magnet (not shown) so as to extend along a body-axis direction (z direction) of the subject 40 placed in the static magnetic field space 11 with the subject 40 accommodated therein. Incidentally, the static magnetic field magnet unit 12 may be of a vertical magnetic field type in addition to the horizontal magnetic field type. Alternatively, the static magnetic field magnet unit 12 may be constituted of a permanent magnet.

The gradient coil unit 13 forms a gradient magnetic field in the static magnetic field space 11 to cause each magnetic resonance signal received by the RF coil unit 14 to have three-dimensional position information. The gradient coil unit 13 has gradient coils of three systems to form three types of gradient magnetic fields corresponding to a slice selection gradient magnetic field, a read gradient magnetic field and a phase encode gradient magnetic field.

The RF coil unit 14 is disposed so as to surround the subject 40, for example. The RF coil unit 14 transmits each RF pulse corresponding to an electromagnetic wave to the subject 40, based on a control signal supplied from the controller 30 within the static magnetic field space 11 formed with the static magnetic field by the static magnetic field magnet unit 12 thereby to form a high frequency magnetic field. Consequently, the spins of proton in the imaging slice area of the subject 40 are excited. The RF coil unit 14 receives an electromagnetic wave generated when each of the spins of proton in the imaging slice area of the subject 40 is returned to its original magnetization vector, as a magnetic resonance signal. The RF coil unit 14 may perform the transmission/reception of each RF pulse through the same RF coil.

In the present embodiment, the RF coil unit 14 transmits RF pulses in the navigator sequence NS and the imaging sequence IS.

The cradle 15 has a table that places the subject 40 thereon. The cradle 15 moves the subject 40 placed on the table between the inside and outside of the static magnetic field space 1, based on a control signal supplied from the controller 30.

The operation console section 3 will be explained.

The operation console section 3 controls the scan section 2 in such a manner that the scan section 2 executes scans for the subject 40. The operation console section 3 generates an image of the subject 40, based on magnetic resonance signals obtained by the scans executed by the scan section 2 and displays the generated image.

Respective parts that constitute the operation console section 3 will be described sequentially.

The RF driver 22 has a gate modulator (not shown), an RF power amplifier (not shown) and an RF oscillator (not shown) to form a high frequency magnetic field within the static magnetic field space 11 by driving the RF coil unit 14. The RF driver 22 modulates an RF signal sent from the RF oscillator to a signal having predetermined timing and predetermined envelope using the gate modulator on the basis of the control signal outputted from the controller 30. The RI driver 22 allows the RF power amplifier to amplify the RF signal modulated by the gate modulator and thereafter outputs the same to the RF coil unit 14.

The gradient driver 23 drives the gradient coil unit 13 based on the control signal of the controller 30 to generate a gradient magnetic field within the static magnetic field space 11. The gradient driver 23 has three-system drive circuits (not shown) in association with the three-system gradient coils of the gradient coil unit 13.

The data acquisition unit 24 has a phase detector (not shown) and an analog/digital converter (not shown) to collect or acquire the magnetic resonance signals received by the RF coil unit 14. The data acquisition unit 24 phase-detects each magnetic resonance signal sent from the RF coil unit 14 by the phase detector with the output of the RF oscillator of the RF driver 22 as a reference signal, and outputs the phase-detected signal to the analog/digital converter. Then, the data acquisition unit 24 converts the magnetic resonance signal corresponding to the analog signal phase-detected by the phase detector into a digital signal by means of the analog/digital converter and outputs it to the data processor 33.

The controller 30 has a computer and a program that allows each part to execute an operation corresponding to a predetermined scan using the computer. The controller 30 is connected to the operation unit 32 to be described later. The controller 30 processes an operation signal inputted to the operation unit 32 and outputs a control signal to the respective parts of the cradle 15, RF driver 22, gradient driver 23 and data acquisition unit 24 to control them. In order to acquire a desired image, the controller 30 controls the data processor 33 and the display unit 34, based on the operation signal sent from the operation unit 32.

In the present embodiment, the controller 30 controls the RF driver 22 and the gradient driver 23 to allow the scan section 2 to execute the navigator sequence NS and the imaging sequence IS. The controller 30 executes control on the imaging sequence IS executed by the scan section 2 on the basis of navigator data obtained by executing the navigator sequence NS and controls the data processor 33 to correct imaging data.

The storage unit 31 has a computer and a program for causing the computer to execute predetermined data processing. The storage unit 31 stores therein the magnetic resonance signals prior to image reconstruction processing, which are acquired by the data acquisition unit 24, and image data or the like subjected to the image reconstruction processing by the data processor 33 to be described later.

The operation unit 32 is made up of operation devices such as a keyboard, a mouse and the like. The operation unit 32 inputs operation data, an imaging protocol and the like from an operator. Further, the operation unit 32 sets an area for executing the imaging sequence IS and an area for executing the navigator sequence NS and outputs the operation data, the imaging protocol and data related to each setting area to the controller 30.

The data processor 33 has a computer and a memory for storing therein a program for allowing the computer to execute predetermined data processing. The data processor 33 executes data processing, based on a control signal outputted from the controller 30.

Figure 2:
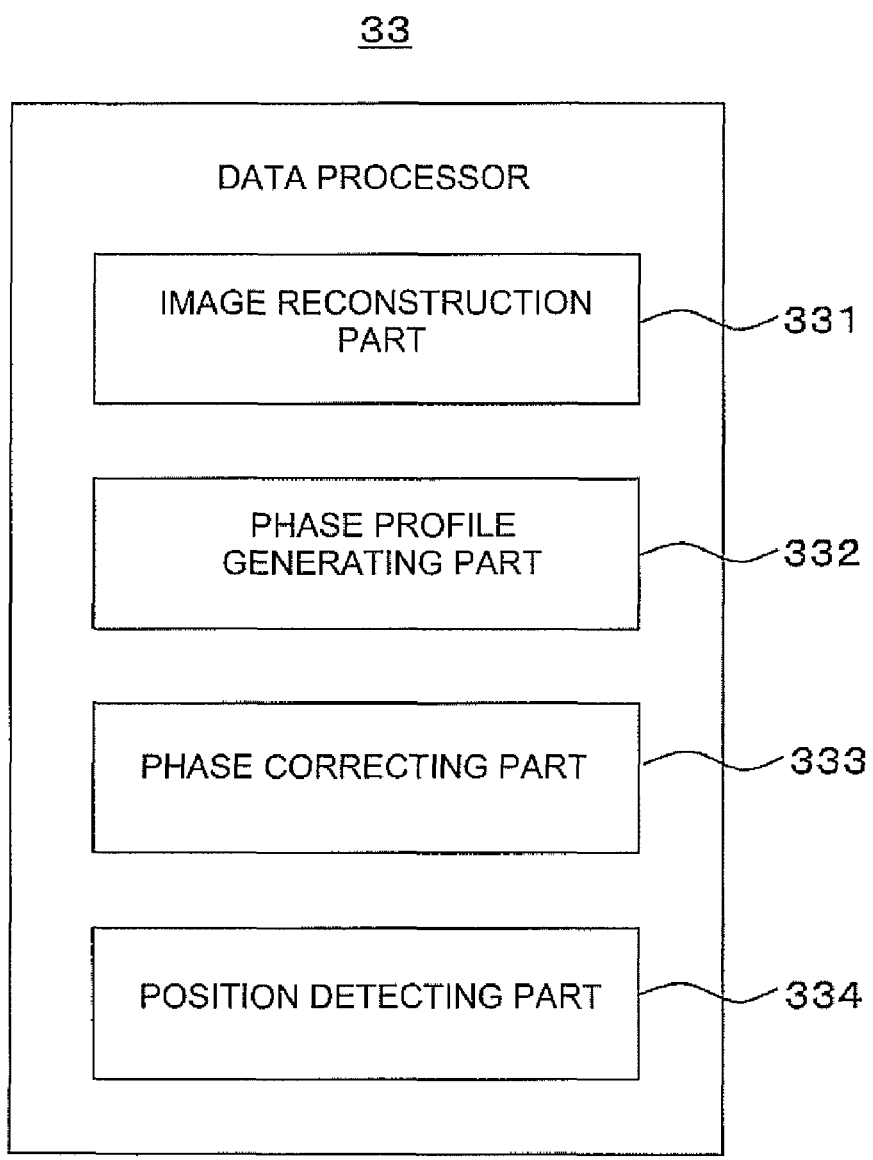
FIG. 2 is a block diagram illustrating a data processor employed in the first embodiment according to the invention.

Here, FIG. 2 is a block diagram showing the construction of the data processor 33 employed in the first embodiment according to the invention.

As shown in FIG. 2, the data processor 33 has an image reconstruction part 331, a phase profile generating part 332, a phase correcting part 333 and a position detecting part 334.

The respective parts of the data processor 33 will be explained sequentially.

The image reconstruction part 331 has a computer and a memory for storing therein a program for allowing the computer to execute predetermined data processing. The image reconstruction part 331 uses each magnetic resonance signal obtained as imaging data by executing the imaging sequence IS about each imaging area of the subject 40, as raw data thereby to image-reconstruct an image about the imaging area of the subject 40. That is, in the present embodiment, the image reconstruction part 331 reconstructs a slice image, based on imaging data acquired by allowing the RF coil unit 14 to transmit RF pulses to the imaging area and allowing the RF coil unit 14 to receive magnetic resonance signals generated at the imaging area upon execution of the imaging sequence IS by the scan section 2. The image reconstruction part 331 outputs the image-reconstructed slice image to the display unit 34.

The phase profile generating part 332 uses each magnetic resonance signal obtained as navigator data by a navigator sequence NS executed prior to the execution of an imaging sequence IS about an imaging area IA of the subject 40, for example, as raw data thereby to produce a phase profile about a navigator area NA of the subject 40. That is, in the present embodiment, the phase profile generating part 332 subjects navigator data acquired into the data acquisition unit 24 by allowing the RF coil unit 14 to transmit RF pulses to the navigator area NA and allowing the RF coil unit 14 to receive magnetic resonance signals generated at the imaging area of the subject, to one-dimensional Fourier transform and plots a relation between a phase P and a position L of the one-dimensional Fourier-transformed data, thereby generating a phase profile.

The phase correcting part 333 performs correction on the phase profile generated by the phase profile generating part 332. In the present embodiment, the phase correcting part 333 corrects the folded-back phase profile. For example, a phase profile is folded back and the phase ranging from 0° to 360° is corrected and defined as an actual phase.

The position detecting part 334 has a computer and a memory for storing therein a program for causing the computer to execute predetermined data processing. The position detecting part 334 detects the position of each tissue in the subject 40, based on a control signal outputted from the controller 30. In the present embodiment, the position detecting part 334 detects a position L of a boundary b between tissues in the subject 40 at the phase profile about the navigator data subjected to the one-dimensional Fourier transform by the phase profile generating part 332. For example, a threshold value $P_{th}$ is set in advance and a position $L_{th}$ at which the phase P at a phase profile becomes the threshold value $P_{th}$, is detected as a boundary b. As the position L of the boundary b between the tissues in the subject 40, for example, the position of the diaphragm located in the boundary between the lung and liver in the subject 40 is detected.

The display unit 34 is constituted of a display device such as a display and displays an image on its display screen, based on a control signal outputted from the controller 30. The display unit 34 displays, for example, an image about each input term for operation data inputted to the operation unit 32 by the operator on the display screen. The display unit 34 displays the slice image of the subject 40 generated by the data processor 33.

The operation of imaging the subject 40 will be explained below using the magnetic resonance imaging apparatus 1 according to the present embodiment.

Figure 3:
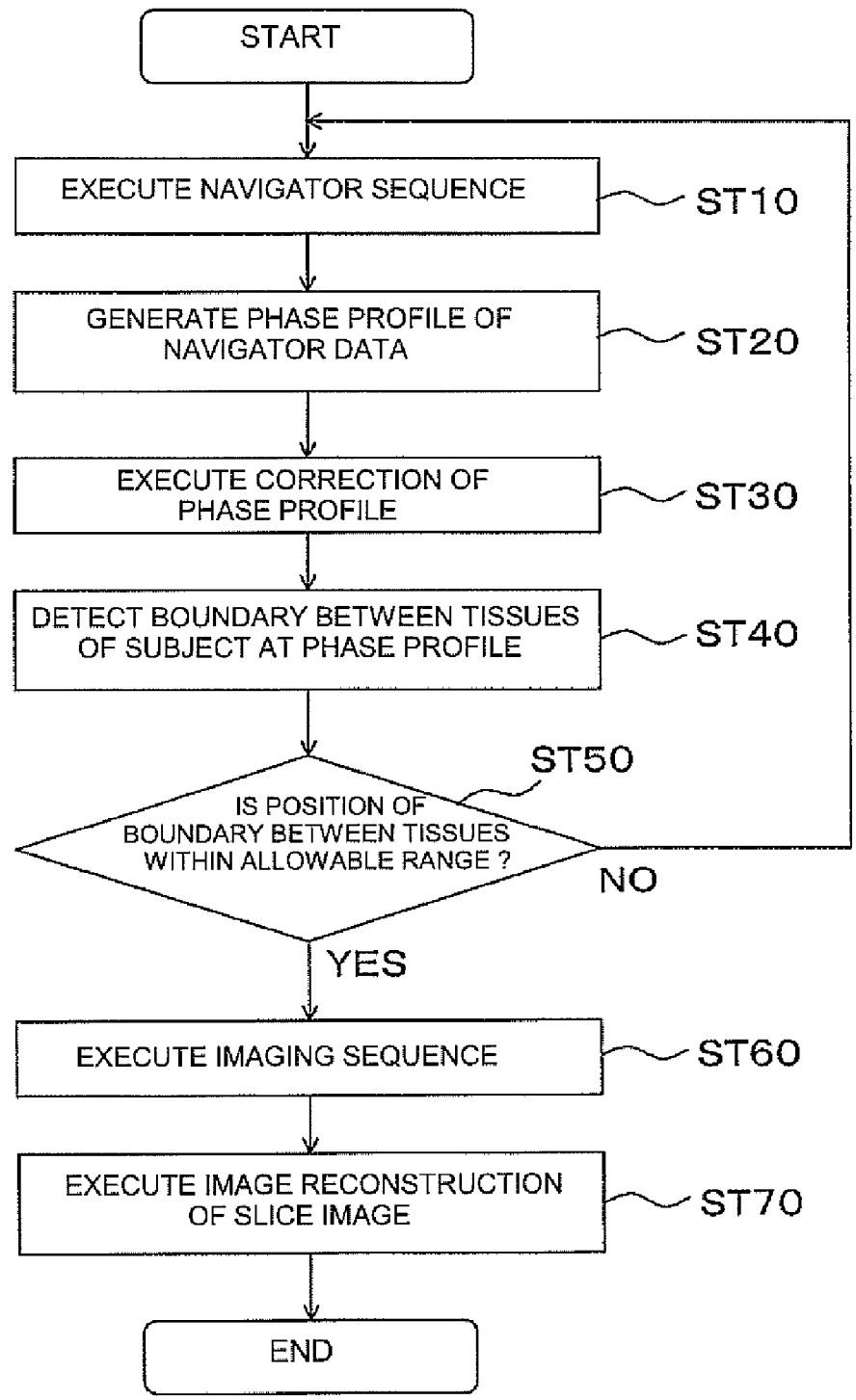
FIG. 3 is a flow chart showing the operation of imaging a subject in the first embodiment according to the invention.
Figure 4:
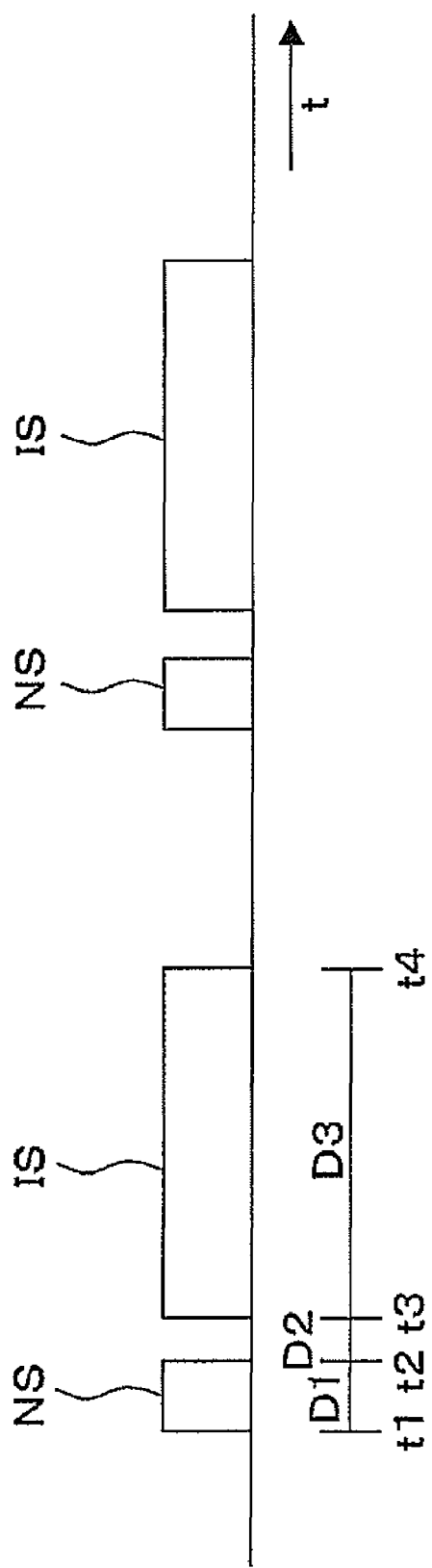
FIG. 4 is a sequence diagram illustrating a sequence for scanning the subject in the first embodiment according to the invention.
Figure 5:
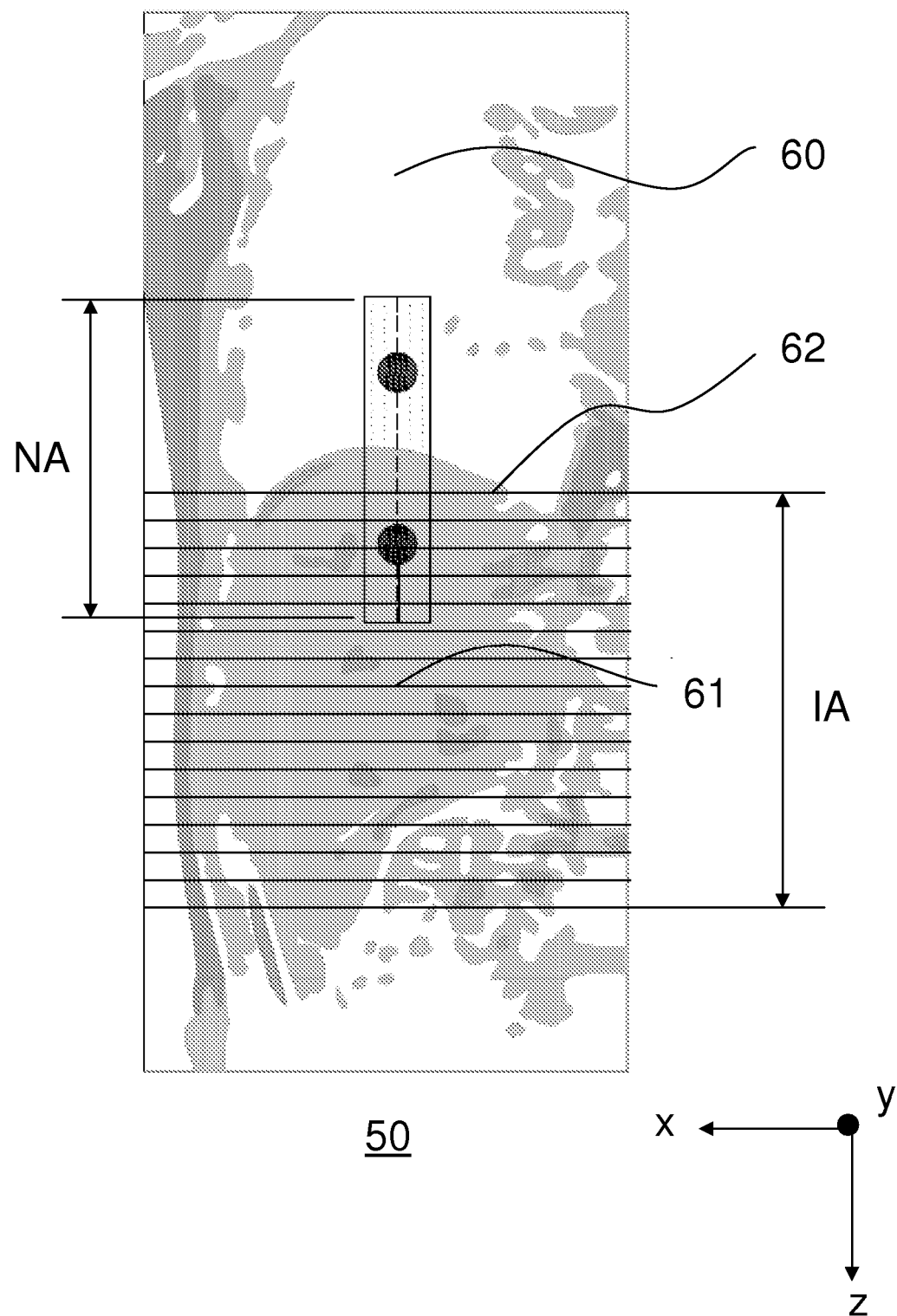
FIG. 5 is a diagram showing a coronal image indicative of a navigator area NA and an imaging area IA in the first embodiment according to the invention.
Figure 6:
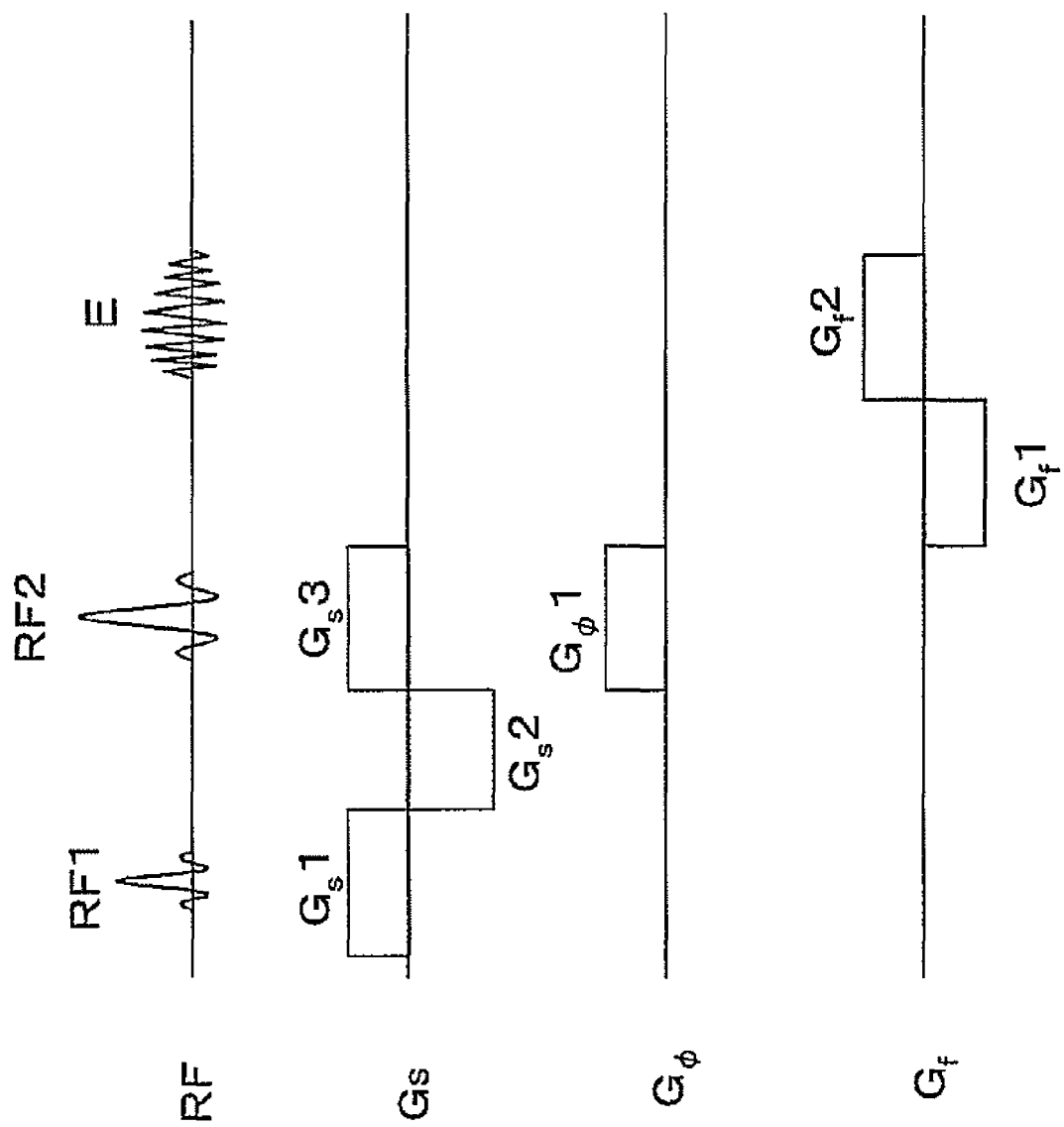
FIG. 6 is a diagram showing a pulse sequence indicative of a navigator sequence in the first embodiment according to the invention.
Figure 7:
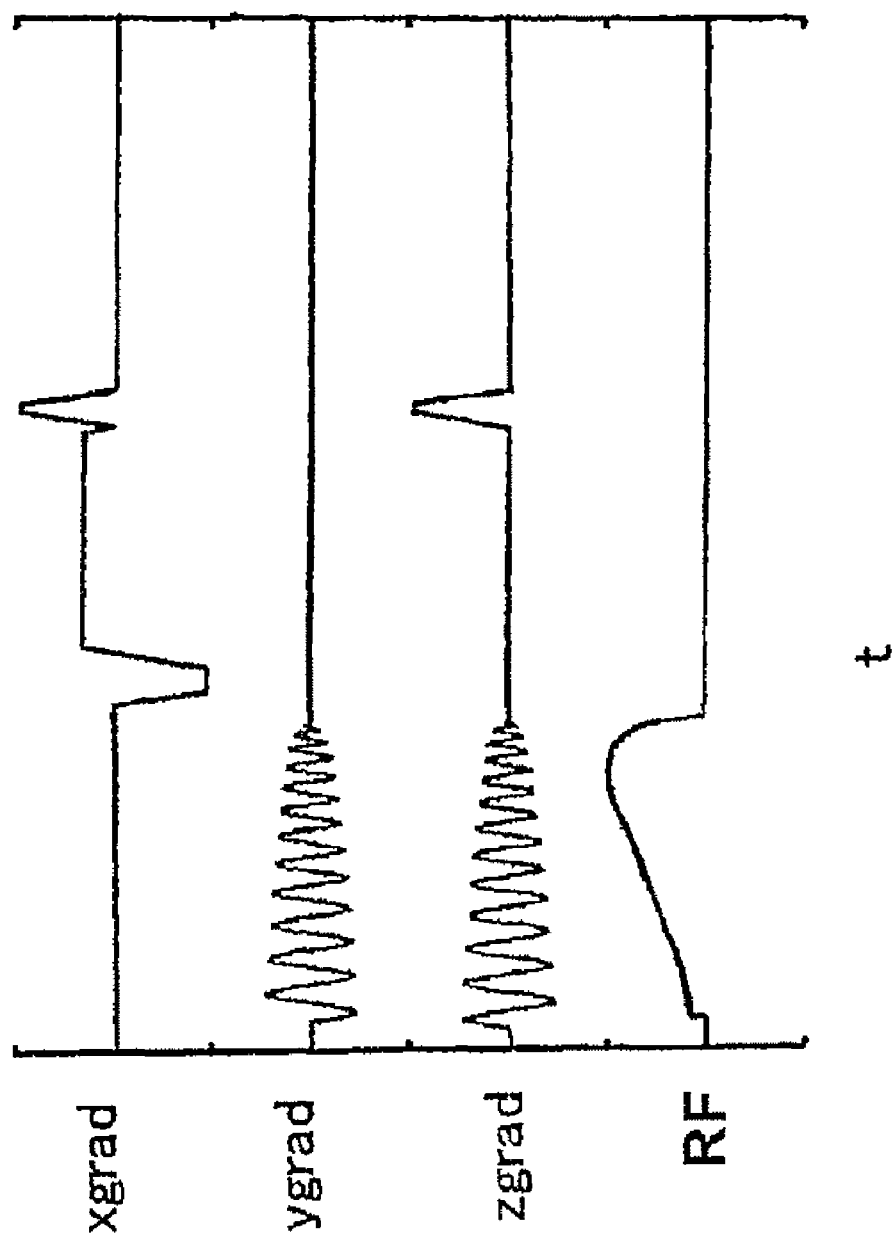
FIG. 7 is a diagram illustrating a pulse sequence indicative of a cylindrical navigator sequence in the first embodiment according to the invention.

FIG. 3 is a flow chart showing the operation of imaging the subject in the first embodiment according to the invention. FIG. 4 is a sequence diagram showing a sequence used when the subject 40 is scanned in the first embodiment according to the invention. The horizontal axis indicates a time base t. FIG. 5 is a diagram showing a coronal image indicative of a navigator area NA and an imaging area IA in the first embodiment according to the invention. A z direction in FIG. 5 indicates the direction of a position L as viewed in the horizontal axis in FIG. 8 to be described later. Incidentally, a black area indicates the lug here. A gray area indicates the liver, and the diaphragm is positioned between the lung and the liver. A rectangular area whose long side is located in a z-axis direction approximately orthogonal to the diaphragm indicates a navigator area NA for executing a navigator sequence NS. At the liver in the coronal image, an area located so as to be parallel to an x-axis direction approximately parallel to the diaphragm indicates an imaging area IA for executing an imaging sequence IS. FIG. 6 is a diagram showing a pulse sequence indicative of a navigator sequence in the first embodiment according to the invention. Gs indicates a slice selection gradient magnetic field, $G_\phi$ indicates a phase encoding gradient magnetic field, $G_f$ indicates a frequency encoding gradient magnetic field, and RF indicates a high frequency pulse, respectively. Incidentally, the vertical axis indicates intensity and the horizontal axis indicates time respectively here. FIG. 7 is a diagram showing a pulse sequence corresponding to a cylindrical gradient echo-type navigator sequence in the first embodiment according to the invention. In this figure, RF indicates a high frequency pulse, xgrad indicates a gradient magnetic field applied in an x-axis direction, ygrad indicates a gradient magnetic field applied in a y-axis direction, and zgrad indicates a gradient magnetic field applied in a z-axis direction. Incidentally, the vertical axis indicates intensity and the horizontal axis indicates time, respectively here.

As shown in FIG. 3, the navigator sequence NS is first executed (ST10).

Here, the scan section 2 executes the navigator sequence NS for the subject 40 to detect a position L of a boundary b between tissues in the subject 40, thereby acquiring navigator data.

As shown in FIG. 4, for example, the navigator sequence NS is executed between a time t1 at which the execution of the navigator sequence NS is started and a time t2 at which a predetermined time D1 has elapsed. Described specifically, the display unit 34 displays a coronal image 50 thereon as shown in FIG. 5 before the execution of the navigator sequence NS. Then, for example, an operator sets an area for executing the navigator sequence onto the coronal image 50 displayed by the display unit 34 as a navigator area NA through the operation unit 32. The set navigator area NA may overlap with the imaging area IA for executing the imaging sequence IS. In the present embodiment as shown in FIG. 5, the navigator area NA is set as a rectangular area which crosses the diaphragm 62 located between the lung 60 and the liver 61 and has a long side parallel to the z-axis direction approximately orthogonal to the diaphragm 62, for example.

At the navigator area NA, a first slice selection gradient magnetic field Gs1 is applied together with a high frequency pulse RF1 of a flip angle 90° as shown in FIG. 6 thereby to selectively 90°-excite a first slice surface containing the diaphragm at the subject 40. Thereafter, a second slice selection gradient magnetic field $G_s2$ is applied to the subject 40 thereby to return the phase. Thereafter, a third slice selection gradient magnetic field $G_s3$ and a first phase encoding gradient magnetic field $G_\phi1$ are applied together with a high frequency pulse RF2 of a flip angle 180° thereby to 180°-excite a second slice surface that intersects with the first slice surface in an area containing the diaphragm.

Then, first and second frequency encoding gradient magnetic fields $G_f1$ and $G_f2$ are applied such that frequency encoding is conducted, so that the scan section 2 acquires a magnetic resonance signal E produced from the area at which the first slice surface and the second slice surface intersect at the subject 40, as navigator data.

At the navigator area NA, a gradient magnetic field is applied so as to continuously vary in polarity in y and z directions alternately simultaneously with the transmission of each RF pulse, for example, as shown in FIG. 7 to select a slice of the subject 40 linearly. Then, such a cylindrical gradient echo-type navigator sequence that a read gradient magnetic field is applied in an x direction may be executed.

Here, as shown in FIG. 5 in the present embodiment, the navigator date needs position information in the direction (z-axis direction) approximately orthogonal to the diaphragm and does not need position information in the direction (x-axis direction) approximately parallel to the diaphragm. Thus, the navigator sequence SN is a sequence for acquiring navigator data free of application of a phase encode gradient magnetic field for acquiring spatial information in the x-axis direction.

Next, as shown in FIG. 3, a phase profile of the navigator data is created (ST20).

Figure 8:
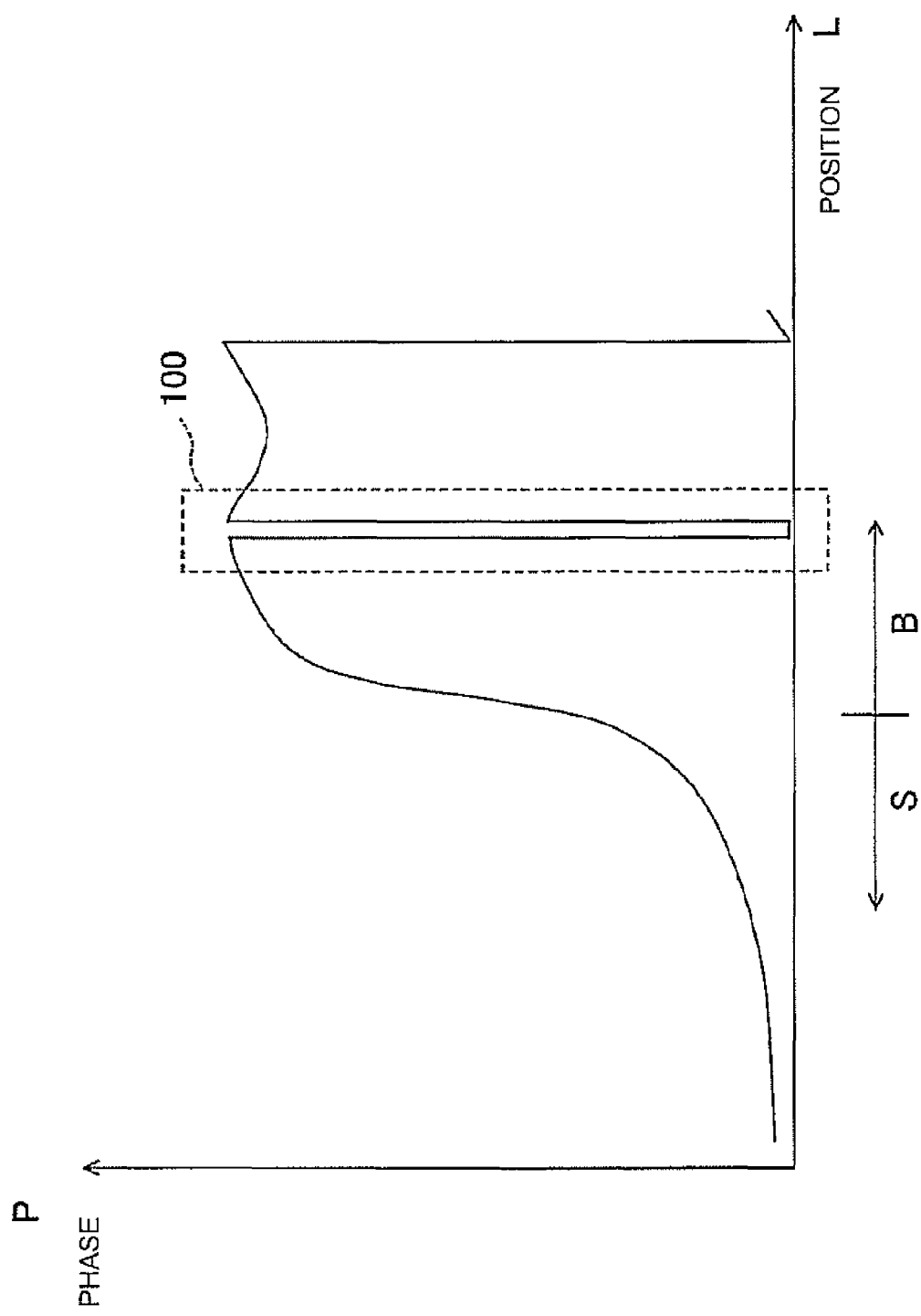
FIG. 8 is a diagram depicting a phase profile in which navigator data is subjected to one-dimensional Fourier transform and the phase is plotted in the first embodiment according to the invention.

Here, the phase profile generating part 332 performs one-dimensional Fourier-transform on the navigator data acquired by executing the navigator sequence NS at Step ST10. Then, the relationship between the phase of the navigator data subjected to the one-dimensional Fourier transform and the position in the z-axis direction at the navigator area NA shown in FIG. 5 is plotted, thereby producing a phase profile. Here, FIG. 8 is a diagram showing a phase profile in which navigator data is subjected to one-dimensional Fourier transform and the phase is plotted in the first embodiment according to the invention. The vertical axis indicates a phase P, and the horizontal axis indicates a position L, respectively. Here, the position L indicates a z-axis direction position at the navigator area NA shown in FIG. 5. An area S small in the phase P indicates the phase of the lung 60 in FIG. 5, and an area B large in the phase P indicates the phase of the liver 61 in FIG. 5. Drawings to be shown below are also similar.

Described specifically, the phase profile generating part 332 effects one-dimensional Fourier transform on the navigator data acquired by the scan section 2 in the z-axis direction shown in FIG. 5.

As shown in FIG. 8, the relation between the phase of the navigator data subjected to the one-dimensional Fourier transform and the position thereof is plotted to produce a phase profile about the navigator data.

Next, as shown in FIG. 3, the correction of the phase profile is executed (ST30).

Figure 9:
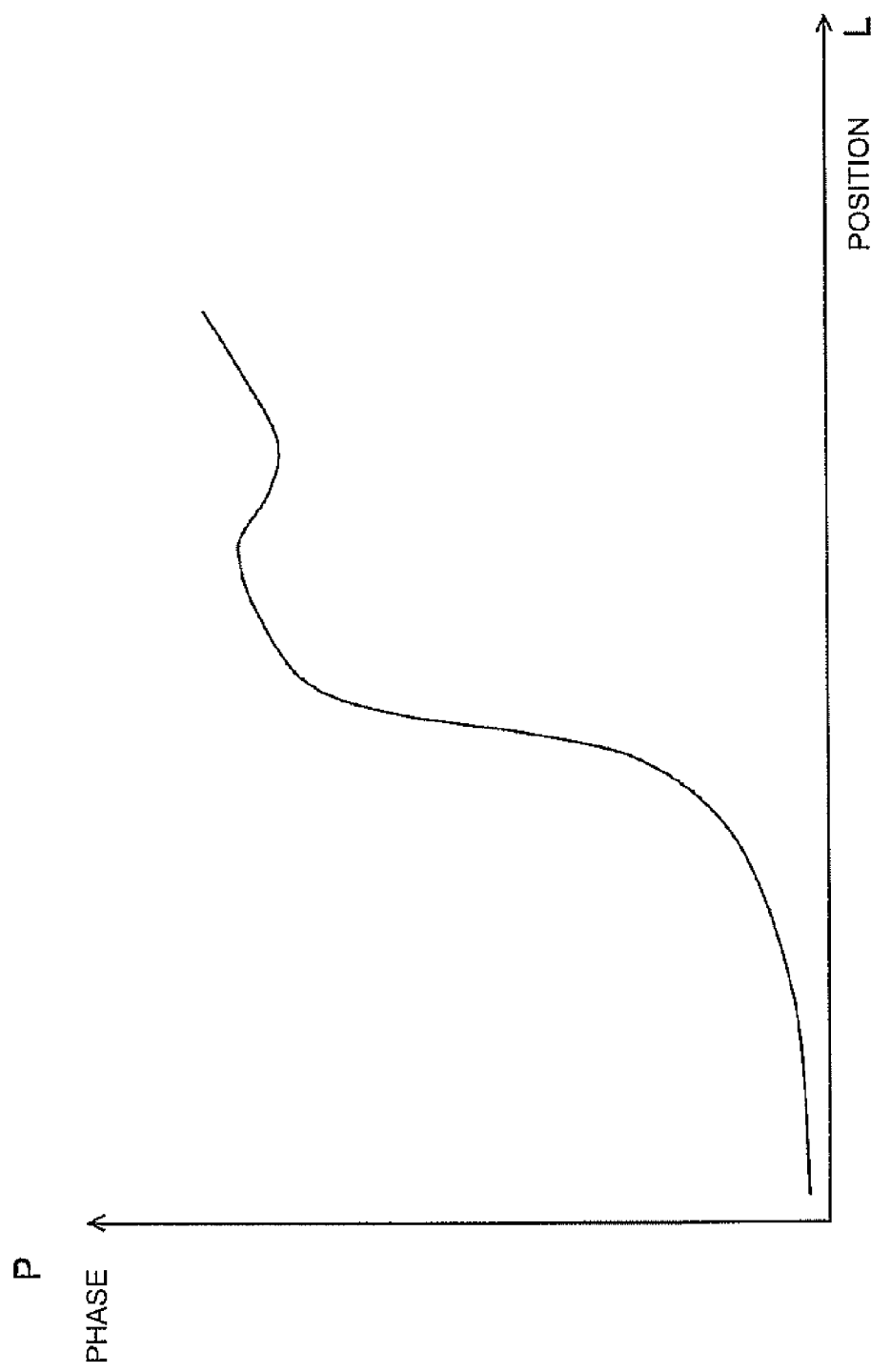
FIG. 9 is a diagram showing a phase profile in which phase correction is conducted in the first embodiment according to the invention.

Here, the phase correcting part 333 executes the correction of the phase profile produced by plotting the phase at Step ST20. Here, FIG. 9 is a diagram showing a phase profile in which the phase has been corrected in the first embodiment according to the invention. The vertical axis indicates a phase P, and the horizontal axis indicates a position L, respectively.

Described specifically, as shown in FIG. 8, a portion 100 at which the phase P surrounded by a broken line is lowered suddenly, i.e., a portion at which the phase P changes discretely, exists in the phase profile. This is because when the phase P reaches 360°, it is folded back to 0° and when the phase P exceeds 360°, a phase portion exceeding 360° becomes a value reckoned from 0°. Thus, the correction of the folded-back phase profile is executed to correct the phase folded to 0° to an actual phase. For example, the phase of 0° is corrected to the phase of 360°, and the phase of 10° is corrected to the phase of 370°. The phase profile subsequent to being subjected to the correction is brought to such a profile as shown in FIG. 9. More specifically, when the difference in phase between adjacent pixels exceeds 180°, for example, 360°×n (where n: positive and negative integers) is added to the phase of one pixel in such a manner that the difference becomes not greater than 180°, and a phase correction is executed in such a manner that the difference in phase between the adjacent pixels becomes not greater than 180° over the entire area, thereby eliminating the folding back of the phase profile.

Next, as shown in FIG. 3, the boundary between tissues of the subject is detected at the phase profile (ST40).

Here, the position detecting part 334 detects the position L of the boundary b between the tissues in the subject 40 at the phase profile in which the phase correction has been conducted at Step ST30, using, for example, an edge detecting method, an LSQ method, a correlation coefficient method, a mutual information amount method or the like.

Figure 10:
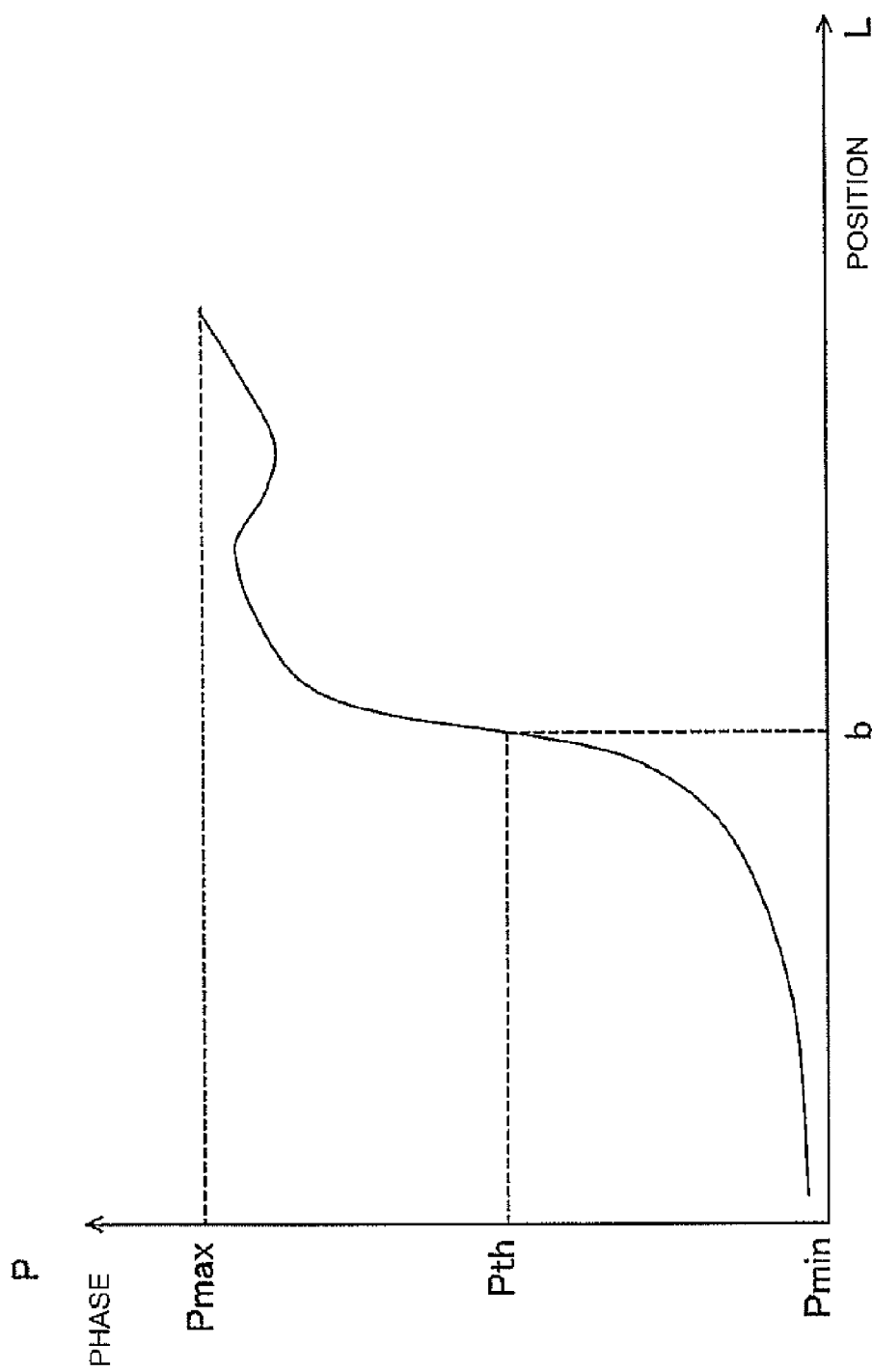
FIG. 10 is a diagram illustrating a phase profile in which the position of a boundary between tissues is detected in the first embodiment according to the invention.

Here, FIG. 10 is a diagram illustrating a phase profile in which the position L of a boundary b between tissues is detected in the first embodiment according to the invention. The vertical axis indicates a phase P, and the horizontal axis indicates a position L, respectively.

Described specifically, as shown in FIG. 10, the position detecting part 334 calculates an average value $(P_{max}+P_{min})/2$ between the maximum and minimum phases $P_{max}$ and $P_{min}$ of the phase P at the phase profile subjected to phase correction by, for example, the edge detecting method, and defines the average value as a threshold value $P_{th}$. When the position L at which the phase reaches greater than or equal to the threshold value $P_{th}$, continues beyond a predetermined length, e.g., 10 pixels at the phase profile, the position detecting part 334 detects a position $L_{th}$ at which the phase P becomes the threshold value Pth, as the position L of the boundary b between the tissues in the subject 40.

The position detecting part 334 calculates a displacement d at which the least square error l(d) expressed in the following equation (1) becomes minimal, using a space profile f(x) of navigator data and a reference navigator data profile fr(x) according to the LSQ method (least squares method), for example. The position detecting part 334 detects the calculated displacement d as the position L of the boundary b between the tissues in the subject 40.

$$l(d) = \sum_{x=x1}^{x=x2} \|f(x-d)\| - |fr(x)\|^2$$

where x1 and x2 are processing executing intervals

For example, the correlation coefficient method by which the position detecting part 334 detects the position L of the boundary b between the tissues in the subject 40 from each correlation value, the mutual information amount method by which the position detecting part 334 detects the position L of the boundary b between the tissues in the subject 40 from the amount of mutual information, or the like may be used.

When the boundary between tissues in the subject at Step S30 is detected at the phase profile shown in FIG. 8 free of execution of the correction at Step ST30, there is a case in which the position L at which the phase becomes greater than or equal to the threshold value $P_{th}$, continues beyond the predetermined length, e.g., 10 pixels even at the portion 100 at which the phase P surrounded by the broken line is lowered suddenly. Although the boundary b between the tissues in the subject 40 does not actually exist in the portion 100 in such a case, there is a possibility that the position $L_{th}$ at which the phase P at the portion 100 becomes the threshold value $P_{th}$, will be detected as the position L of the boundary b between the tissues in the subject 40. Thus, the correction of the phase profile is executed at Step ST30.

As the boundary between the tissues in the subject 40, which can be detected as mentioned above, may be mentioned, for example, the diaphragm 62 lying in the boundary between the lung 60 and the liver 61 at the subject 40, etc.

Next, as shown in FIG. 3, it is determined whether the position of the boundary between the tissues is within an allowable range (ST50).

Here, the controller 30 performs comparative processing about the determination as to whether the position L of the boundary b between the tissues in the subject 40, which has been detected at the phase profile detected by the position detecting part 334 at Step ST40, is within the allowable range.

Described specifically, the controller 30 performs processing for comparing between the position L of the boundary b between the tissues in the subject 40, which has been detected by the position detecting part 334, and each of upper and lower limit values in a predetermined allowable range thereby to determine whether the position is within the allowable range.

When the position of the boundary b is less than or equal to the upper limit value and greater than or equal to the lower limit value as a result of the comparison between the position of the boundary b and the upper and lower limit values in the predetermined allowable range, it is determined that the position is within the allowable range. When the position of the boundary b exceeds the upper limit value or is less than the lower limit value, it is determined that the position is not within the allowable range.

When it is determined that as shown in FIG. 3, the position of the boundary b is not within the allowable range (NO), the navigator sequence is executed again (ST10) to produce a phase profile of navigator data (ST20). The correction of the phase profile is executed (ST30) and the boundary between tissues in the subject is detected at the phase profile (ST40).

Next, as shown in FIG. 3, the imaging sequence is executed (ST60).

When it is now determined at Step ST50 that the position of the boundary b is within the allowable range (YES), the scan section 2 executes the imaging sequence IS of the subject 40 to acquire imaging data.

Described specifically, as shown in FIGS. 4 and 5, the scan section 2 executes the imaging sequence IS at the imaging area IA at the subject 40 to acquire each magnetic resonance signal as imaging data. For example, the corresponding imaging sequence IS is executed at the imaging area IA at the liver 61 of the subject 40 to acquire imaging data. As shown in FIG. 4, the imaging sequence IS is executed between a time t3 after a predetermined time D2 has elapsed from the time t2 at the end of the corresponding navigator sequence and at which the imaging sequence IS is started, and a time t4 after a predetermined time D3 has elapsed.

The imaging sequence IS is executed plural times at the imaging area IA so as to correspond to all phase encode steps in a k space thereby to acquire imaging data.

Next, as shown in FIG. 3, the image reconstruction of a slice image is executed (ST70).

Here, the image reconstruction part 331 image-reconstructs the slice image of the subject 40 using the imaging data acquired at the Step ST60. For example, the image reconstruction part 331 image-reconstructs a slice image of the liver 61 at the subject 40. Then, the image reconstruction part 331 outputs the image-reconstructed slice image to the display unit 34.

As described above, the first embodiment of the invention sets the navigator area NA and executes the navigator sequence NS at the set navigator area NA. Then, one-dimensional Fourier transform is performed on each acquired navigator data. The phase profile in which the phase of each navigator data subjected to the one-dimensional Fourier transform is plotted, is produced. The correction of the produced phase profile is executed. The average value between the maximum and minimum phases of the phase profile subjected to the above correction is calculated by the edge detecting method, and the calculated average value is sets as the threshold value $P_{th}$. When the position L at which the phase P reaches greater than or equal to the threshold value $P_{th}$, continues over the predetermined length, e.g., 10 pixels at the phase profile, the position $L_{th}$ at which the phase P becomes the threshold value $P_{th}$ is detected as the position L of the boundary b between the tissues in the subject 40. In the case of the LSQ method, d at which the least square error l(d) of the space profile f(x) of the navigator data and the reference navigator data profile fr(x) becomes minimal is calculated. The displacement d is defined as the position L of the boundary b between the tissues in the subject 40. When the position L of the boundary b is within the allowable range, the imaging sequence IS is executed to acquire the imaging data. The image reconstruction part image-reconstructs the slice image of the subject using the acquired imaging data.

Thus, even though the navigator area NA and the imaging area IA overlap with each other, the phase-plotted phase profile does not cause signal disturbance due to the interference of the imaging scan. Therefore, the position of the boundary between the tissues in the subject can be detected accurately at the phase profile subject to the correction. Since the position of the boundary between the tissues can accurately be detected, it is possible to prevent the occurrence of body-motion artifacts at the image-reconstructed slice image and obtain the corresponding slice image good in image quality.

Figure 11:
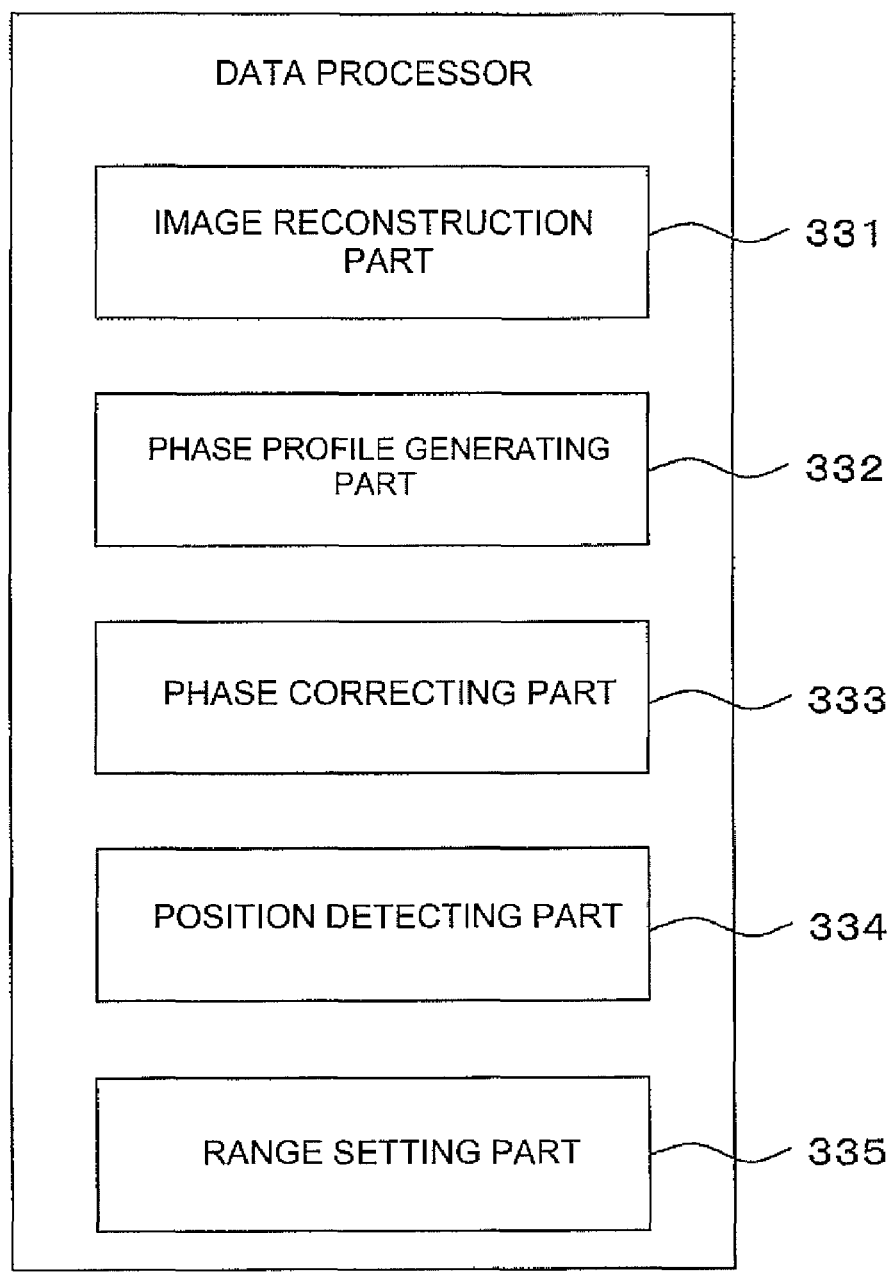
FIG. 11 is a block diagram showing a construction of a data processor employed in a second embodiment according to the invention.

FIG. 11 is a block diagram showing a construction of a data processor 33 employed in a second embodiment according to the invention. The present data processor is one example illustrative of the embodiment of the invention.

The second embodiment is identical to the first embodiment in terms of the portions other than a range setting part 335 corresponding to the construction of a magnetic resonance imaging apparatus 1. Therefore, the description of dual portions will be omitted.

As shown in FIG. 11, the data processor 33 has the image reconstruction part 331, phase profile generating part 332, phase correcting part 333, position detecting part 334 and range setting part 335.

The range setting part 335 sets, for example, a range for detecting a position L of a boundary b between tissues in a subject 40 to a phase profile subjected to the correction by the phased correcting part 333. In the present embodiment, an operator recognizes and decides, through the corresponding operation unit 32, the range for detecting the position L of the boundary b between the tissues in the subject 40, which has been set by the range setting part 335.

The operation of imaging the subject 40 using the magnetic resonance imaging apparatus 1 of the present embodiment will be explained below with reference to FIG. 12.

Since portions other than the setting of the range for detecting the boundary between the tissues in the subject, corresponding to Step ST35 at an operation flow, and the detection of the boundary between the tissues in the subject, corresponding to Step S36, are identical to those in the first embodiment. Therefore, the description of dual portions will be omitted.

Figure 12:
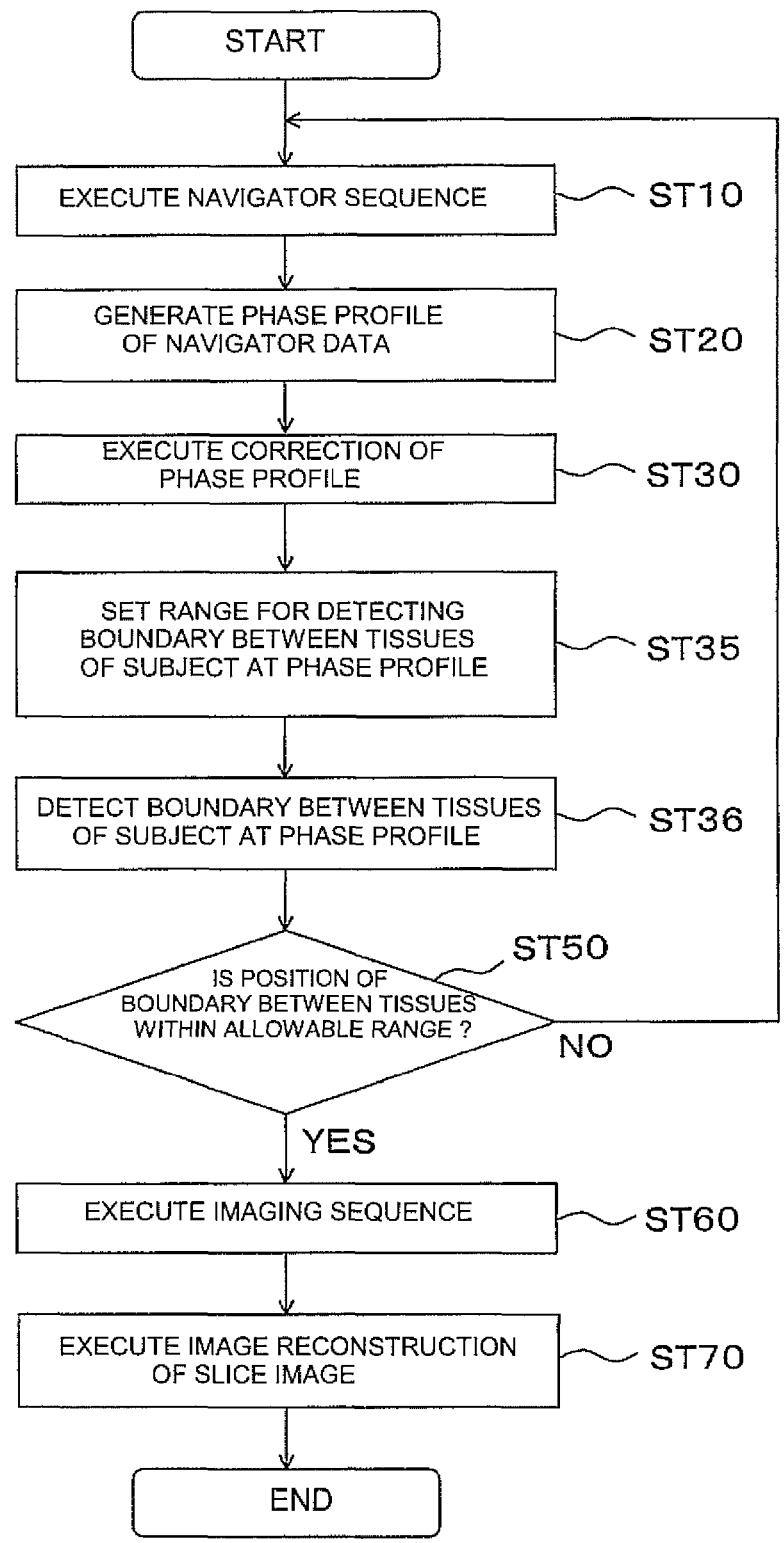
FIG. 12 is a flow chart depicting the operation of imaging a subject in the second embodiment according to the invention.

FIG. 12 is a flow chart showing the operation of imaging the subject in the second embodiment according to the invention.

As shown in FIG. 12, a range for detecting a boundary between tissues at a phase profile is set (ST35).

Figure 13:
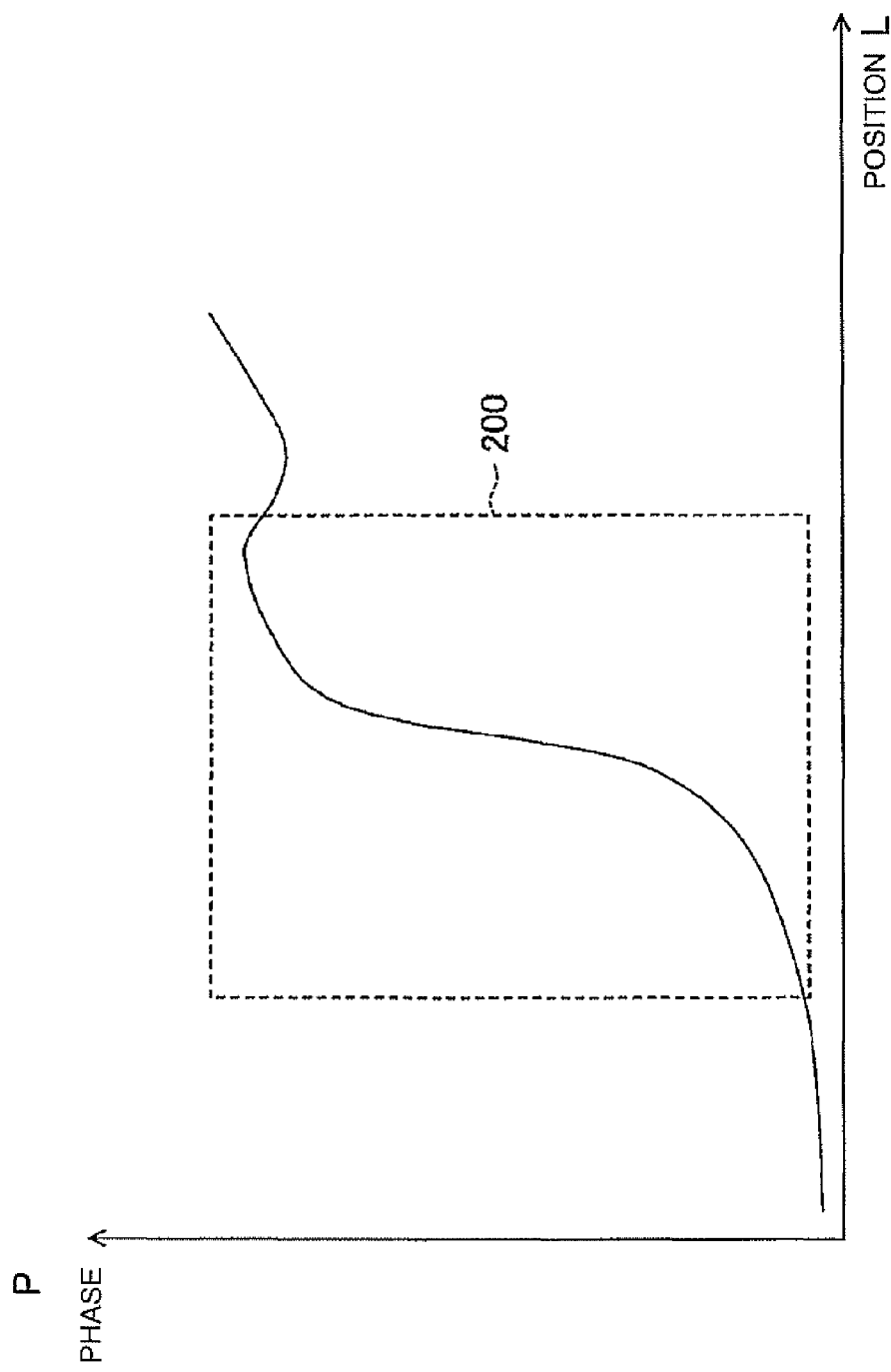
FIG. 13 is a diagram showing a phase profile to which a range for detecting the position of a boundary between tissues in the second embodiment according to the invention is set.

Here, at Step ST30, the operator executes the setting of a range 200 for detecting a position L of a boundary b between tissues in the subject 40 through the operation unit 32. Here, FIG. 13 is a diagram showing a phase profile to which a range for detecting a position L of a boundary b between tissues in the second embodiment according to the invention is set. A broken line indicates the range 200 for detecting the position of the boundary b between the tissues.

Described specifically, at Step ST30 as shown in FIG. 13, the operator sets a rectangular area for detecting a position L of a boundary b between tissues in the subject 40 to a phase profile subjected to phase correction through the operation unit 32. When the resolution of a navigator is 256, for example, the rectangular area, that is, an area at a position L corresponding to 128 pixels about the center of the position L at the phase profile is set as the range 200 for detecting the boundary b.

Next, as shown in FIG. 12, the boundary between the tissues in the subject is detected at the phase profile (ST36).

Here, the position detecting part 334 detects the position L of the boundary b between the tissues in the subject 40 at the phase profile to which the range 200 for detecting the position L of the boundary b between the tissues at the phase profile is set at Step ST35, using, for example, an edge detecting method, an LSQ method, a correlation coefficient method, a mutual information amount method or the like.

Figure 14:
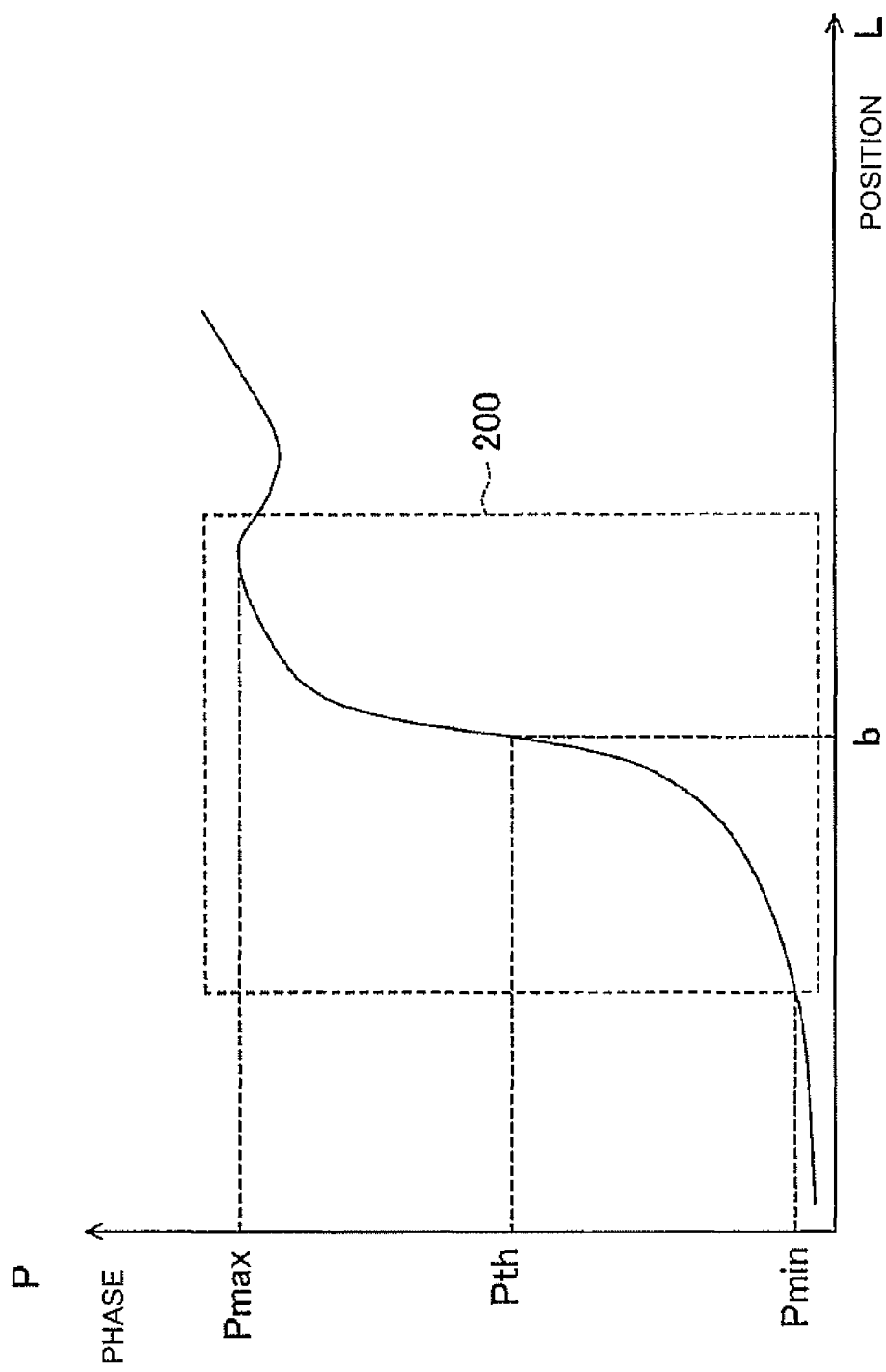
FIG. 14 is a diagram illustrating a phase profile in which the position of a boundary between tissues is detected in the second embodiment according to the invention.

Here, FIG. 14 is a diagram showing a phase profile in which a position L of a boundary b between tissues is detected in the second embodiment of the invention. The vertical axis indicates a phase P, and the horizontal axis indicates a position L, respectively.

Described specifically, as shown in FIG. 14, the position detecting part 334 calculates an average value $(P_{max}+P_{min})/2$ between the maximum and minimum values $P_{max}$ and $P_{min}$ of the phase P lying within a set range 200 for detecting the boundary b at the phase profile to which the range 200 is set, by, for example, the edge detecting method, and defines the average value as a threshold value $P_{th}$. When the position L at which the phase reaches greater than or equal to the threshold value $P_{th}$, continues over a predetermined length, e.g., 10 pixels at the phase profile, the position detecting part 334 detects a position $L_{th}$ at which the phase P becomes the threshold value $P_{th}$, as the position L of the boundary b between the tissues in the subject 40.

The position detecting part 334 calculates a displacement d at which the least square error l(d) expressed in the equation (1) becomes minimal, using a space profile f(x) of navigator data and a reference navigator data profile fr(x) according to the LSQ method. The position detecting part 334 detects the calculated value as the position L of the boundary b between the tissues in the subject 40.

For example, a correlation coefficient method by which the position detecting part 334 detects the position L of the boundary b between the tissues in the subject 40 from each correlation value, the mutual information amount method by which the position detecting part 334 detects the position L of the boundary b between the tissues in the subject 40 from the amount of mutual information, or the like may be used.

In the second embodiment of the invention as described above, the operator sets the range 200 for detecting the position L of the boundary b between the tissues in the subject 40 to the phase profile subjected to the phase correction. Then, the average value between the maximum and minimum phases of the phase profile subjected to the correction is calculated at the range 200 by the edge detecting method, and the calculated value is set as the threshold value $P_{th}$. When the position L at which the phase becomes greater than or equal to the threshold value $P_{th}$, continues over the predetermined length, e.g., 10 pixels at the phase profile, the position $L_{th}$ at which the phase P becomes the threshold value $P_{th}$ is detected as the position L of the boundary b between the tissues in the subject 40. In the case of the LSQ method, d at which the least square error l(d) of the space profile f(x) of the navigator data and the reference navigator data profile fr(x) becomes minimal is calculated within the range 200 set to the phase profile. The displacement d is defined as the position L of the boundary b between the tissues in the subject 40.

By setting the range for detecting the position of the boundary between the tissues in the subject to the phase profile in this way, the position of the boundary between the tissues in the subject can more accurately be detected at the phase profile. Since the position of the boundary between the tissues can be detected more accurately, it is possible to prevent the occurrence of body-motion artifacts at the image-reconstructed slice image and obtain the corresponding slice image good in image quality.

Figure 15:
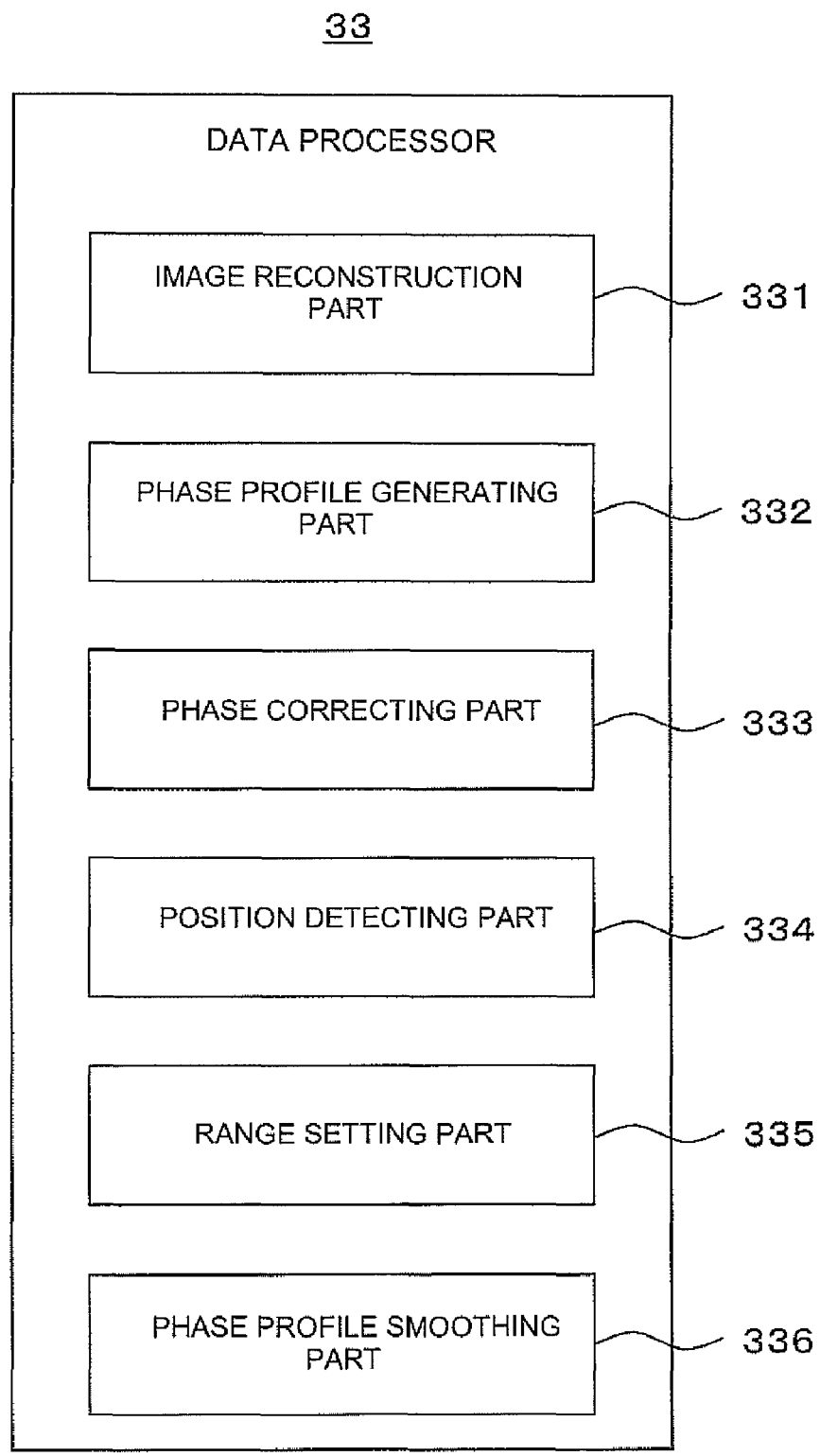
FIG. 15 is a block diagram showing a construction of a data processor employed in a third embodiment according to the invention.

FIG. 15 is a block diagram showing a construction of a data processor 33 employed in a third embodiment according to the invention. The present data processor is one example illustrative of the embodiment of the invention.

The third embodiment is identical to the second embodiment in terms of the portions other than a phase profile smoothing part 336 corresponding to the construction of a magnetic resonance imaging apparatus 1. Therefore, the description of dual portions will be omitted.

As shown in FIG. 15, the data processor 33 has the image reconstruction part 331, phase profile generating part 332, phase correcting part 333, position detecting part 334, range setting part 335 and phase profile smoothing part 336.

When, for example, a phase profile subjected to correction by the phase correcting part 333 is discontinuous, the phase profile smoothing part 336 smoothes the phase profile. In the present embodiment, the phase profile smoothing part 336 filters, for example, data of an input phase profile by neighbor averaging or a filter such as a median filter to smooth the phase profile.

The operation of imaging a subject 40 using the magnetic resonance imaging apparatus 1 of the present embodiment will be explained below with reference to FIG. 16.

Since portions other than the smoothing of a phase profile, corresponding to Step ST31 at an operation flow are identical to those in the second embodiment. Therefore, the description of dual portions will be omitted.

Figure 16:
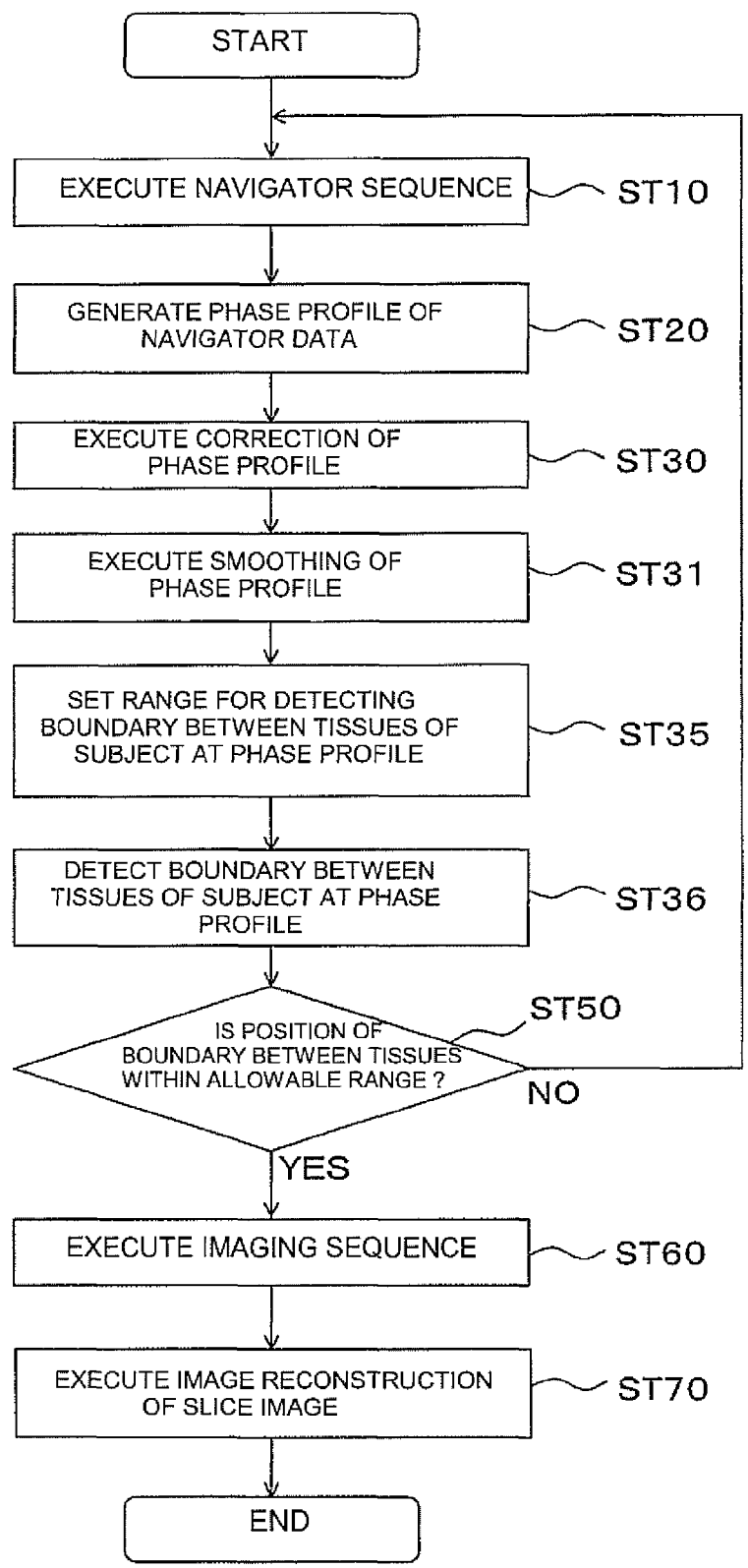
FIG. 16 is a flow chart illustrating the operation of imaging a subject in the second embodiment according to the invention.

FIG. 16 is a flow chart showing the operation of imaging the subject in the third embodiment according to the invention.

As shown in FIG. 16, the smoothing of the phase profile is executed (ST31).

Figure 17:
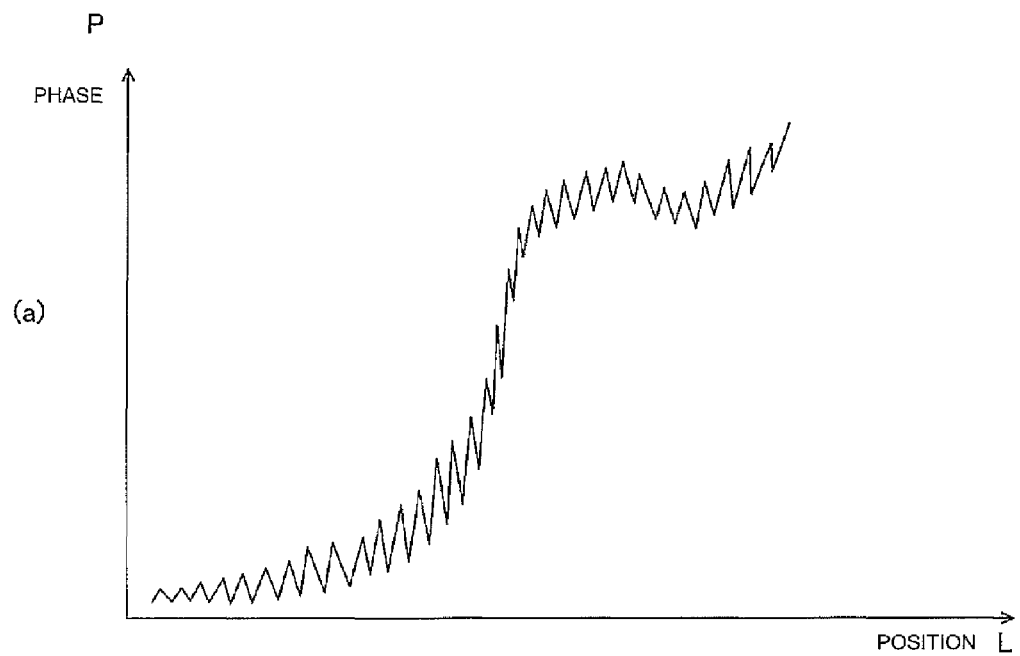
FIGS. 17(a) and 17(b) are diagrams showing phase profiles in the second embodiment according to the invention.
Figure 17:
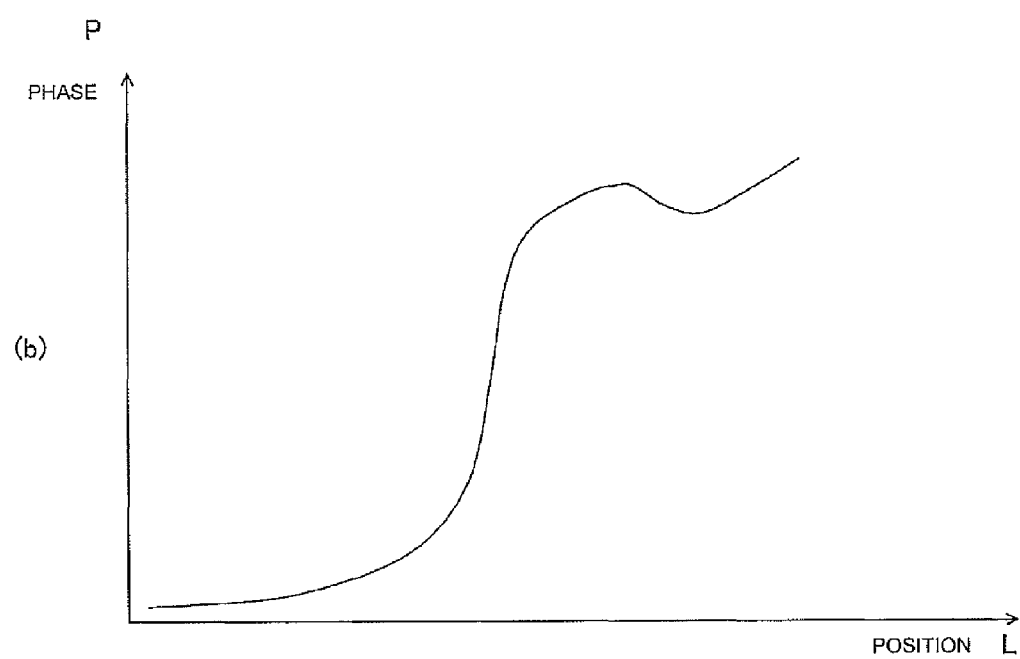
Figure 18:
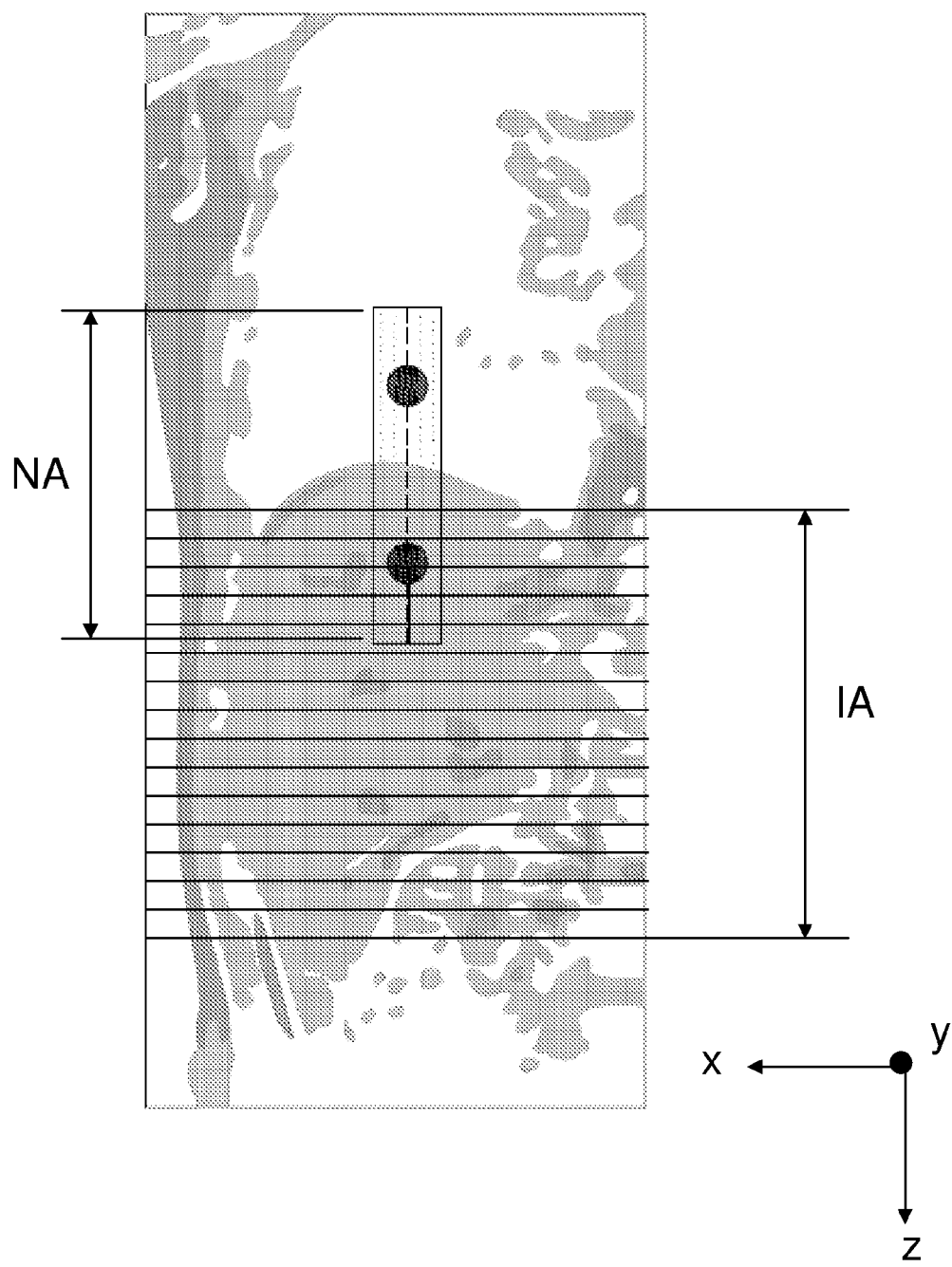
FIG. 18 is a diagram illustrating a coronal image indicative of a navigator area NA and an imaging area IA for describing a prior art.
Figure 19:
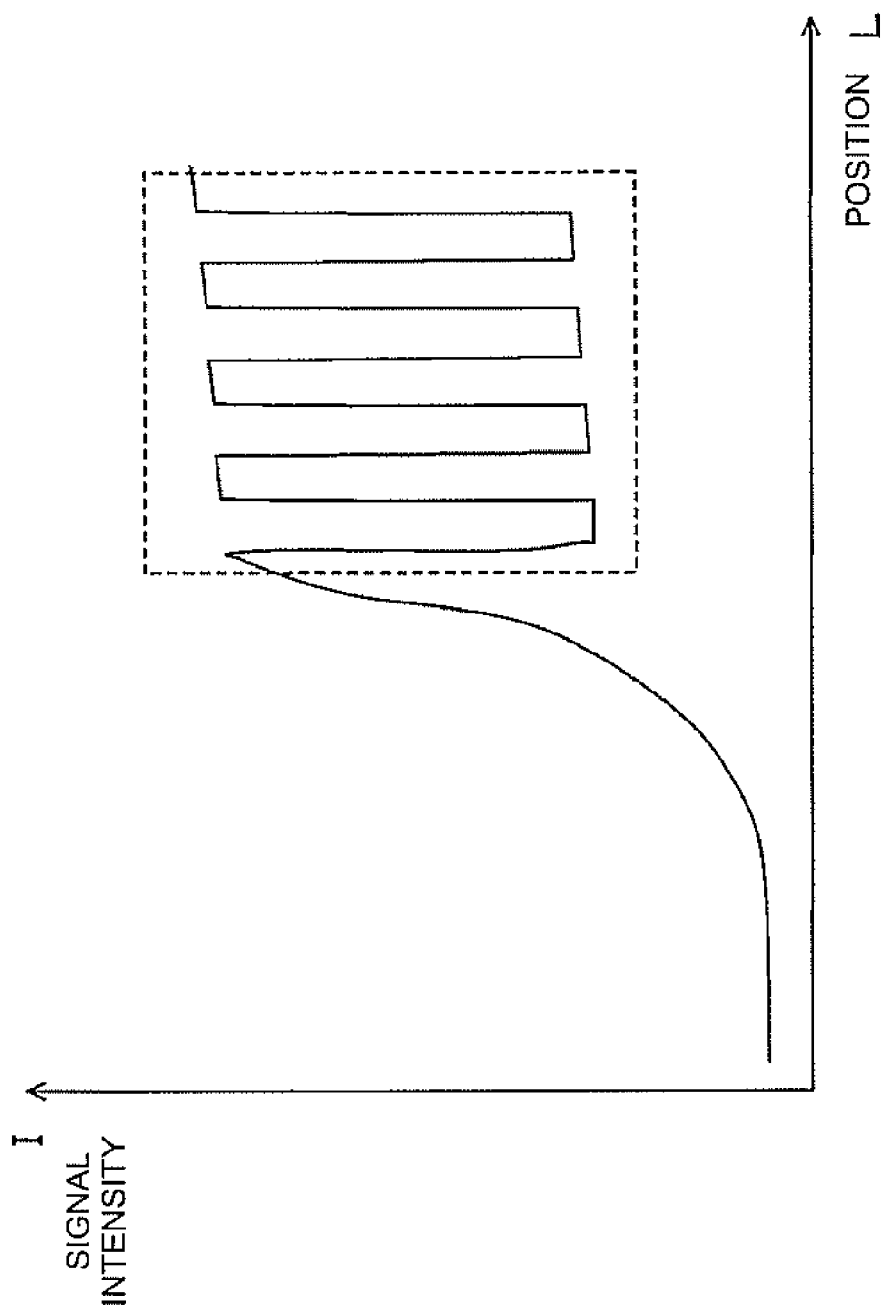
FIG. 19 is a diagram showing a signal intensity profile for describing the prior art.

Here, the phase profile smoothing part 336 executes smoothing of the phase profile subjected to phase correction at Step ST30. Here, FIGS. 17(a) and 17(b) are diagrams showing phase profiles in the third embodiment according to the invention. FIG. 17(a) is a diagram showing a phase profile before discontinuity of a phase P is smoothed, and FIG. 17(b) is a diagram showing a phase profile after discontinuity of a phase P has been smoothed.

Described specifically, there is a case in which phase discontinuity occurs in the phase profile subjected to the phase correction as shown in FIG. 17(a) at Step ST30. In this case, the phase profile is subjected to, for example, neighbor averaging or a smoothing filter such as a medial filter to smooth the phase profile. Smoothing the phase profile shown in FIG. 17(a) results in the phase profile shown in FIG. 17(b).

Here, the neighbor averaging is filtering in which at a given position L in a phase profile, for example, the average value of phases P of three points corresponding to a phase P at the corresponding position L and phases P at adjoining positions L is defined as the phase P at the corresponding position L. The medial filter is filtering in which at a given position L in a phase profile, for example, the centrally-located phase at the time that phases P of three points corresponding to a phase P at the corresponding position L and phases P at adjoining positions L are arranged in order of magnitude of the phase is defined as the phase P at the corresponding position L.

In the third embodiment of the invention as described above, the phase profile smoothing part 336 executes the smoothing of the phase profile subjected to the correction. For example, the neighbor averaging or the smoothing filter such as the medial filter is effected on the phase profile as smoothing to smooth the phase profile.

By smoothing the phase profile in this way, the position of the boundary between the tissues in the subject can be detected more accurately. Since the position of the boundary between the tissues can be detected more accurately, it is possible to prevent the occurrence of body-motion artifacts at an image-reconstructed slice image and obtain the corresponding slice image good in image quality.

Incidentally, the position detecting part 334 employed in the present embodiment corresponds to a boundary detecting part of the invention.

Incidentally, the invention is not limited to the above embodiments upon its implementation. Various modified forms can be adopted.

Although the range for detecting the position of the boundary between the tissues is set to the phase profile after execution of the smoothing of the phase profile in the third embodiment of the invention, the invention is not limited to it. The smoothing of the phase profile may be carried out after the range for detecting the position of the boundary between the tissues has been set to the phase profile.

Although the imaging sequence is executed after the detection of the position of the boundary between the tissues in the subject in the embodiment of the invention, the invention is not limited to it. The imaging sequence may be conducted before the detection of the position of the boundary between the tissues in the subject. The imaging sequence may be done before execution of the navigator sequence.

Although, in the embodiment of the invention, the position of the boundary between the tissues in the subject is detected at the phase profile generated using the acquired navigator data, and it is determined based on the position of the boundary whether the imaging sequence should be executed, the invention is not limited to it. The imaging data may be selected based on the position of the boundary. The imaging data may be corrected based on the position of the boundary.

Although when the position of the boundary at the subject, which has been detected by the position detecting part, and the upper and lower limit values in the preset allowable range are compared and the result of comparison is within the allowance range, the imaging sequence is executed in the embodiment of the invention, the invention is not limited to it. When it is beyond the allowable range, the acquired imaging data is removed. When it is within the allowable range, the acquired imaging data may be selected. The acquired imaging data may be corrected based on the position of the boundary at the subject, which has been detected by the position detecting part.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging apparatus configured to generate an image of an imaging area by executing a first scan using a navigator sequence to acquire navigator data based on a magnetic resonance signal from a navigator area containing tissues body-moved in a subject and by executing a second scan using an imaging sequence for acquiring a magnetic resonance signal from the imaging area as imaging data at the subject, said magnetic resonance imaging apparatus comprising:
   a phase profile generating part configured to generate a phase profile that shows a relationship between a phase of the navigator data and a position of the navigator area;
   a phase correcting part configured to correct folding back of the phase profile; and
   a position detecting part configured to detect a position of a tissue body-moved in the navigator area based on the phase profile.

2. The magnetic resonance imaging apparatus according to claim 1, wherein the first scan and the second scan overlap with each other.

3. The magnetic resonance imaging apparatus according to claim 1, further comprising a range setting part configured to set a range for detecting a position of each tissue in the subject, in the phase profile of the magnetic resonance signal, which is subjected to phase correction by said phase correcting part.

4. The magnetic resonance imaging apparatus according to claim 2, further comprising a range setting part configured to set a range for detecting a position of each tissue in the subject, in the phase profile of the magnetic resonance signal, which is subjected to phase correction by said phase correcting part.

5. The magnetic resonance imaging apparatus according to claim 1, wherein said position detecting part is configured to detect the position of the tissue in the subject by an edge detecting method.

6. The magnetic resonance imaging apparatus according to claim 1, wherein said position detecting part is configured to detect the position of the tissue in the subject by an LSQ method.

7. The magnetic resonance imaging apparatus according to claim 1, wherein said position detecting part is configured to detect the position of the tissue in the subject by a correlation coefficient method.

8. The magnetic resonance imaging apparatus according to claim 1, wherein said position detecting part is configured to detect the position of the tissue in the subject by a mutual information amount method.

9. The magnetic resonance imaging apparatus according to claim 5, wherein the tissue is the diaphragm.

10. The magnetic resonance imaging apparatus according to claim 1, further comprising a phase profile smoothing part configured to smooth the corrected phase profile.

11. A navigator data analyzing method for use with an imaging system including an image reconstruction part, a phase profile generating part, a phase correcting part, and a position detection part, said method comprising:
- executing a first scan and a second scan in which RF pulses are transmitted to a subject within a static magnetic field space and magnetic resonance signals are acquired from the subject in order to acquire imaging data;
- generating a slice image of the subject and navigator data for detecting a position of each tissue in the subject using the image reconstruction part;
- generating a phase profile using the phase profile generating part in order to show a relationship between a phase of the navigator data and a position of a navigator area;
- correcting folding back of the phase profile using the phase correcting part; and
- detecting a position of a tissue body-moved in the navigator area based on the corrected phase profile using the position detecting part.

12. The navigator data analyzing method according to claim 11, wherein executing a first scan and a second scan comprises executing the first and second scans such that the first and second scans overlap with each other.

13. The navigator data analyzing method according to claim 11, further comprising setting a range for detecting a position of each tissue in the subject, in the phase profile subjected to the phase correction using a range setting part of the imaging system.

14. The navigator data analyzing method according to claim 12, further comprising setting a range for detecting a position of each tissue in the subject, in the phase profile subjected to the phase correction using a range setting part of the imaging system.

15. The navigator data analyzing method according to claim 11, wherein detecting a position of a tissue comprises detecting the position of the tissue in the subject by an edge detecting method.

16. The navigator data analyzing method according to claim 11, wherein detecting a position of a tissue comprises detecting the position of the tissue in the subject by an LSQ method.

17. The navigator data analyzing method according to claim 11, wherein detecting a position of a tissue comprises detecting the position of the tissue in the subject by a correlation coefficient method.

18. The navigator data analyzing method according to claim 11, wherein detecting a position of a tissue comprises detecting the position of the tissue in the subject by a mutual information amount method.

19. The navigator data analyzing method according to claim 15, wherein the tissue is the diaphragm.

20. The navigator data analyzing method according to claim 11, further comprising smoothing the corrected phase profile using a phase profile smoothing part of the imaging system.

* * * * *